(12) United States Patent
Song

(10) Patent No.: US 11,844,215 B2
(45) Date of Patent: Dec. 12, 2023

(54) THREE-DIMENSIONAL FLASH MEMORY DEVICE SUPPORTING BULK ERASE OPERATION AND MANUFACTURING METHOD THEREFOR

(71) Applicant: SAMSUNG ELECTRONICS CO., LTD., Suwon-si (KR)

(72) Inventor: Yunheub Song, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 315 days.

(21) Appl. No.: 17/058,948

(22) PCT Filed: May 28, 2019

(86) PCT No.: PCT/KR2019/006362
§ 371 (c)(1),
(2) Date: Nov. 25, 2020

(87) PCT Pub. No.: WO2019/231205
PCT Pub. Date: Dec. 5, 2019

(65) Prior Publication Data
US 2021/0217770 A1 Jul. 15, 2021

(30) Foreign Application Priority Data

May 29, 2018 (KR) .......................... 10-2018-0060897
Jul. 16, 2018 (KR) .......................... 10-2018-0082128

(51) Int. Cl.
*H01L 27/11582* (2017.01)
*H10B 43/27* (2023.01)
(Continued)

(52) U.S. Cl.
CPC .......... *H10B 43/27* (2023.02); *H01L 23/5226* (2013.01); *H10B 41/27* (2023.02); *G11C 16/16* (2013.01)

(58) Field of Classification Search
None
See application file for complete search history.

(56) References Cited

U.S. PATENT DOCUMENTS 8,541,768 B2 9/2013 Shima et al.
8,907,402 B2 12/2014 Shinohara
(Continued)

FOREIGN PATENT DOCUMENTS

CN 114975452 A * 8/2022 ......... G11C 16/0483
JP 2011-253943 A 12/2011
(Continued)

OTHER PUBLICATIONS

"Son et al., 3-Dimension Non-Volatile Semiconductor Device Having Source Line, 2016" (Year: 2016).*
(Continued)

*Primary Examiner* — Jarrett J Stark
(74) *Attorney, Agent, or Firm* — Lee IP Law, P.C.

(57) ABSTRACT

Provided are a three-dimensional flash memory device supporting a bulk erase operation and a method of manufacturing the three-dimensional flash memory device. The three-dimensional flash memory device supporting a bulk erase operation includes: a string including a channel layer extending in one direction and a plurality of electrode layers stacked vertically with respect to the channel layer; an upper wiring layer on the string; at least one intermediate wiring layer arranged between the plurality of electrode layers through the channel layer in an intermediate region of the string; a lower wiring layer under the string; and at least one connector arranged in the at least one intermediate wiring layer and connecting, to each other, at least two channel layers divided by the at least one intermediate wiring layer.

11 Claims, 40 Drawing Sheets

(51) Int. Cl.
  *H01L 23/522* (2006.01)
  *H10B 41/27* (2023.01)
  *G11C 16/16* (2006.01)

(56) References Cited

U.S. PATENT DOCUMENTS

| | | | |
|---|---|---|---|
| 9,035,372 B2* | 5/2015 | Song | H10B 43/27 |
| | | | 257/314 |
| 9,224,752 B1 | 12/2015 | Lee et al. | |
| 10,217,758 B2 | 2/2019 | Oh | |
| 10,283,518 B2 | 5/2019 | Lee et al. | |
| 11,195,842 B2* | 12/2021 | Leobandung | H10B 41/27 |
| 2006/0190313 A1 | 8/2006 | Lu | |
| 2011/0180941 A1 | 7/2011 | Hwang et al. | |
| 2016/0190313 A1 | 6/2016 | Koval et al. | |
| 2017/0154892 A1 | 6/2017 | Oh | |
| 2021/0217770 A1* | 7/2021 | Song | H10B 43/35 |

FOREIGN PATENT DOCUMENTS

| | | |
|---|---|---|
| JP | 2014-053585 A | 3/2014 |
| KR | 10-2008-0067281 A | 7/2008 |
| KR | 10-2011-0001527 A | 1/2011 |
| KR | 10-1263182 B1 | 5/2013 |
| KR | 10-2015-0067811 A | 6/2015 |
| KR | 10-2016-0020210 A | 2/2016 |
| KR | 10-2016-0095557 A | 8/2016 |
| KR | 10-2017-0062870 A | 6/2017 |
| WO | WO-2019231205 A1 * 12/2019 ......... H01L 23/5226 |

OTHER PUBLICATIONS

International Search Report dated Sep. 20, 2019 for PCT/KR2019/006362.
Notice of Allowance dated Nov. 25, 2019 for corresponding KR App No. 10-2018-0060897.
Notice of Allowance dated Dec. 10, 2019 for corresponding KR App No. 10-2018-0082128.

* cited by examiner

US 11,844,215 B2

THREE-DIMENSIONAL FLASH MEMORY DEVICE SUPPORTING BULK ERASE OPERATION AND MANUFACTURING METHOD THEREFOR

CROSS REFERENCE TO RELATED APPLICATIONS

This is the U.S. national phase application based on PCT/KR2019/006362, filed May 28, 2019, which is based on Korean Patent Application No. 10-2018-0060897, filed May 29, 2018, and Korean Patent Application No. 10-2018-0082128, filed Jul. 16, 2018, the entire contents of all of which are hereby incorporated by reference.

TECHNICAL FIELD

The present disclosure relates to a three-dimensional flash memory device and a method of manufacturing the three-dimensional flash memory device, and more particularly, to a three-dimensional flash memory device that has a structure supporting a bulk erase operation.

BACKGROUND ART

Flash memory devices are electrically erasable programmable read only memory (EEPROM), and thus may be commonly used for, for example, computers, digital cameras, MP3 players, game systems, memory sticks, and the like. Such flash memory devices electrically control the input and output of data by Fowler-Nordheim tunneling (F-N tunneling) or hot electron injection.

Specifically, referring to FIG. 1 illustrating an array of existing three-dimensional flash memory, the array of the existing three-dimensional flash memory may include a common source line CSL, a bit line BL, and a plurality of cell strings CSTR between the common source line CSL and the bit line BL.

Bit lines are two-dimensionally arranged, and the plurality of cell strings CSTR are connected in parallel to each of the bit lines. The cell strings CSTR may be commonly connected to the common source line CSL. That is, the plurality of cell strings CSTR may be arranged between a plurality of bit lines and one common source line CSL. A plurality of common source lines CSL may be provided and may be two-dimensionally arranged. An electrically equal voltage may be applied to the plurality of common source lines CSL, or each of the plurality of common source lines CSL may be electrically controlled.

Each of the cell strings CSTR may include a ground select transistor GST connected to the common source line CSL, a string select transistor SST connected to a bit line BL, and a plurality of memory cell transistors MCT between the ground select transistor GST and the string select transistor SST. In addition, the ground select transistor GST, the string select transistor SST, and the memory cell transistors MCT may be connected in series.

The common source line CSL may be commonly connected to sources of the ground select transistors GST. In addition, the ground select line GSL, a plurality of word lines WL0 to WL3, and a plurality of string select lines SSL, which are arranged between the common source line CSL and the bit line BL, may be used as electrode layers of the ground select transistor GST, the memory cell transistors MCT, and the string select transistors SST, respectively. Further, each of the memory cell transistors MCT includes a memory element.

Regarding the existing three-dimensional flash memory, to achieve excellent performance and low price required by consumers, the degree of integration has been increased by vertically stacking cells.

For example, referring to FIG. 2 illustrating a structure of existing three-dimensional flash memory, an electrode structure 215, in which interlayer dielectrics 211 and horizontal structures 250 are alternately and repeatedly formed, is arranged on a substrate 200 to manufacture the existing three-dimensional flash memory. The interlayer dielectrics 211 and the horizontal structures 250 may extend in a first direction. Each of the interlayer dielectrics 211 may include, for example, a silicon oxide film, and a lowermost interlayer dielectric 211a from among the interlayer dielectrics 211 may have a thickness less than that of the other interlayer dielectrics 211. Each of the horizontal structures 250 may include first and second blocking insulating films 242 and 243 and an electrode layer 245. A plurality of electrode structures 215 may be provided and may be arranged in a second direction to face each other, the second direction intersecting the first direction. The first and second directions may correspond to an x-axis and a y-axis, respectively, in FIG. 2. Trenches 240 may extend in the first direction between the plurality of electrode structures 215 to separate the plurality of electrode structures 215 from each other. Heavily doped impurity regions may be formed in the substrate 200 exposed by the trenches 240, thereby arranging the common source line CSL. Although not shown, isolation insulating films may be further arranged to fill the trenches 240.

Vertical structures 230 may be arranged through the electrode structure 215. In an example, in a plan view, the vertical structures 230 may be aligned in the first and second directions and thus arranged in a matrix form. In another example, the vertical structures 230 may be aligned in the second direction and arranged in zigzag in the first direction. Each of the vertical structures 230 may include a protective film 224, a charge storage film 225, a tunnel insulating film 226, and a channel layer 227. For example, the channel layer 227 may have a tubular shape having an empty inside, and in this case, a filling film 228 may be further arranged to fill the inside of the channel layer 227. A drain region D may be located on the channel layer 227, and a conductive pattern 229 may be formed on the drain region D and connected to the bit line BL. The bit line BL may extend in a direction intersecting the horizontal structures 250, for example, the second direction. In an example, the vertical structures 230 aligned in the second direction may be connected to one bit line BL.

The first and second blocking insulating films 242 and 243 in the horizontal structures 250, and the charge storage film 225 and the tunnel insulating film 226 in the vertical structures 230 may define an oxide-nitride-oxide (ONO) layer, which is an information storage element of the three-dimensional flash memory. That is, portions of the information storage element may be included in the vertical structures 230, and the other portions thereof may be included in the horizontal structures 250. As an example, of the information storage element, the charge storage film 225 and the tunnel insulating film 226 may be included in the vertical structures 230, and the first and second blocking insulating films 242 and 243 may be included in the horizontal structures 250.

Epitaxial patterns 222 may be arranged between the substrate 200 and the vertical structures 230. The epitaxial patterns 222 connect the substrate 200 to the vertical structures 230. The epitaxial patterns 222 may contact at least one horizontal structure 250. That is, the epitaxial patterns 222 may be arranged to contact a lowermost horizontal structure 250a. According to another embodiment, the epitaxial patterns 222 may be arranged to contact a plurality of horizontal structures 250, for example, two horizontal structures 250. When the epitaxial patterns 222 are arranged to contact the lowermost horizontal structure 250a, the lowermost horizontal structure 250a may have a thickness greater than that of the other horizontal structures 250. The lowermost horizontal structure 250a contacting the epitaxial patterns 222 may correspond to the ground select line GSL of the array of the three-dimensional flash memory described with reference to FIG. 1, and the other horizontal structures 250 contacting the vertical structures 230 may correspond to the plurality of word lines WL0 to WL3.

Each of the epitaxial patterns 222 has a recessed sidewall 222a. Accordingly, the lowermost horizontal structure 250a contacting the epitaxial patterns 222 is placed along a profile of the recessed sidewall 222a. That is, the lowermost horizontal structure 250a may be placed in an inwardly convex shape along the recessed sidewall 222a of the epitaxial patterns 222.

In the existing three-dimensional flash memory having such a structure, as the number of layers vertically stacked increases, the length of the channel layer 227 increases, which causes a reduction in a cell current and deterioration of cell characteristics.

To increase the cell current that decreases with the increase of the length of a channel layer in the three-dimensional flash memory and to reduce the deterioration of the cell characteristics due to the reduction in the cell current, a structure in which at least one intermediate wiring layer is arranged in an intermediate region of a string has been proposed.

However, in a three-dimensional flash memory device having a structure in which at least one intermediate wiring layer is arranged, because a channel layer in a string is divided into an upper channel layer and a lower channel layer due to the at least one intermediate wiring layer, it is difficult to apply an erase operation based on a bulk of the substrate 200.

Therefore, the following embodiments of the present disclosure propose a technique for supporting a bulk erase operation in a three-dimensional flash memory device, which includes at least one intermediate wiring layer to increase a cell current that decreases with the increase of the length of the channel layer and to reduce the deterioration in the cell characteristics due to the reduction in the cell current.

In addition, when the intermediate wiring layer is implemented merely in the same shape as an existing bit line, because a degree of complexity of a wiring process increases and a degree of integration decreases, the following embodiments of the present disclosure propose a structure including an intermediate wiring layer fabricated by a simple wiring process while allowing improvement of the degree of integration.

DESCRIPTION OF EMBODIMENTS

Technical Problem

Embodiments of the present disclosure provide: a three-dimensional flash memory device, which has a structure including at least one intermediate wiring layer capable of being reconfigured to be adaptively used as one of a source electrode and a drain electrode, and which supports a bulk erase operation based on a bulk of a substrate by forming, in the at least one intermediate wiring layer, at least one connector that connects at least two channel layers divided by the at least one intermediate wiring layer to each other; and a method of manufacturing the three-dimensional flash memory device.

In addition, embodiments of the present disclosure provide: a three-dimensional flash memory device, which includes a channel connector connecting an upper channel layer to a lower channel layer and a wiring connector connecting the channel connector to an intermediate wiring layer, thereby allowing a degree of integration of a structure including the intermediate wiring layer to be improved and a wiring process to be simplified; and a method of manufacturing the three-dimensional flash memory device.

Further, embodiments of the present disclosure provide: a three-dimensional flash memory device, which allows integration and size-reduction to be achieved by forming an upper wiring layer, at least one intermediate wiring layer, and a lower wiring layer in an inversely stepwise shape to different extension lengths from each other and thus respectively connecting thereto plugs formed on the same line on a single substrate; and a method of manufacturing the three-dimensional flash memory device.

Technical Solution to Problem

According to an aspect of the present disclosure, a three-dimensional flash memory device includes: a string that includes a channel layer extending in one direction and a plurality of electrode layers stacked vertically with respect to the channel layer; an upper wiring layer arranged on the string; at least one intermediate wiring layer arranged between the plurality of electrode layers through the channel layer in an intermediate region of the string; a lower wiring layer arranged under the string; and at least one connector arranged in the at least one intermediate wiring layer and connecting at least two channel layers to each other, the at least two channel layers being divided by the at least one intermediate wiring layer.

According to an embodiment of the present disclosure, the at least one connector may include an N− layer and an N+ layer that surrounds the N− layer and contacts the at least one intermediate wiring layer.

According to another embodiment of the present disclosure, the at least one connector may include an N− layer surrounded by and contacting the at least one intermediate wiring layer.

According to yet another embodiment of the present disclosure, the at least one connector may include an N+ layer surrounded by and contacting the at least one intermediate wiring layer.

According to yet another embodiment of the present disclosure, the 3-dimensional flash memory device may be manufactured on a substrate including a P type bulk and an N+ contact and may support a bulk erase operation as the at least two channels connected to each other by the at least one connector are connected to the bulk.

According to yet another embodiment of the present disclosure, the at least one connector may include: an N+ layer deposited under the at least one intermediate wiring layer; and an N− layer arranged on the N+ layer and surrounded by and contacting the at least one intermediate wiring layer.

According to yet another embodiment of the present disclosure, the at least one connector may include: an N+ layer deposited under the at least one intermediate wiring layer; and an N− layer surrounded by and contacting both the N+ layer and the at least one intermediate wiring layer.

According to yet another embodiment of the present disclosure, the upper wiring layer, the at least one intermediate wiring layer, and the lower wiring layer may form an inversely stepwise shape with extension lengths thereof being different from each other.

According to yet another embodiment of the present disclosure, the respective extension lengths of the upper wiring layer, the at least one intermediate wiring layer, and the lower wiring layer may decrease in the stated order.

According to yet another embodiment of the present disclosure, due to the inversely stepwise shape formed by the upper wiring layer, the at least one intermediate wiring layer, and the lower wiring layer, the upper wiring layer, the at least one intermediate wiring layer, and the lower wiring layer may be respectively connected to plugs on the same line on a single substrate.

According to yet another embodiment of the present disclosure, each of the upper wiring layer, the at least one intermediate wiring layer, and the lower wiring layer may be adaptively used as one of a drain electrode and a source electrode.

According to another aspect of the present disclosure, a method of manufacturing a three-dimensional flash memory device includes: preparing a plurality of structures, each including a string that includes a plurality of electrode layers, a plurality of interlayer dielectrics, and a channel layer, the plurality of electrode layers and the plurality of interlayer dielectrics being alternately stacked, and the channel layer extending in one direction through the plurality of electrode layers and the plurality of interlayer dielectrics; forming at least three plug holes by etching at least portions of a base layer of a substrate; depositing a metal plug in each of the at least three plug holes; forming a lower wiring layer to be connected to one of the at least three metal plugs; stacking one of the plurality of structures on the lower wiring layer; forming connection plugs in the one structure to extend in the one direction, the connection plugs being respectively connected to remaining metal plugs except for the one of the at least three metal plugs; forming at least one intermediate wiring layer to be connected to one of the connection plugs; stacking a remaining one of the plurality of structures except for the one structure on the at least one intermediate wiring layer; forming a connection plug in the remaining one structure to extend in the one direction, the connection plug being connected to a metal plug other than the metal plug connected to the at least one intermediate wiring layer from among the remaining metal plugs; and forming an upper wiring layer to be connected to one of the connection plugs, wherein the upper wiring layer, the at least one intermediate wiring layer, and the upper wiring layer form an inversely stepwise shape with extension lengths thereof being different from each other.

According to an embodiment of the present disclosure, the respective extension lengths of the upper wiring layer, the at least one intermediate wiring layer, and the lower wiring layer may decrease in the stated order.

According to another embodiment of the present disclosure, due to the inversely stepwise shape formed by the upper wiring layer, the at least one intermediate wiring layer, and the lower wiring layer, the upper wiring layer, the at least one intermediate wiring layer, and the lower wiring layer may be respectively connected to the metal plugs formed on the same line on the substrate.

According to yet another embodiment of the present disclosure, the forming of the at least one intermediate wiring layer may include forming at least one connector in the at least one intermediate wiring layer, the at least one connector connecting a channel layer, which is included in the one structure under the at least one intermediate wiring layer, to a channel layer, which is included in the remaining one structure on the at least one intermediate wiring layer.

According to yet another aspect of the present disclosure, a three-dimensional flash memory includes: a string including a channel layer that extends in one direction; a channel connector arranged in an intermediate region of the string and connecting an upper channel layer and a lower channel layer of the string to each other; an intermediate wiring layer selectively usable as one of a source electrode and a drain electrode for the string; and a wiring connector connecting the channel connector to the intermediate wiring layer while being at least partially buried in the string.

According to an embodiment of the present disclosure, the wiring connector may include an N+ type material, and the channel connector may include one of a metal material and an N− type material.

According to another embodiment of the present disclosure, the 3-dimensional flash memory may be manufactured on a substrate including a P type bulk and an N+ contact and may support a bulk erase operation as the upper channel layer and the lower channel layer of the string are connected to the bulk by the channel connector.

According to yet another embodiment of the present disclosure, the intermediate wiring layer may be located in a space between the string and a neighbor string adjacent to the string.

According to yet another embodiment of the present disclosure, the intermediate wiring layer may be shared by the string and the neighbor string adjacent to the string.

According to yet another aspect of the present disclosure, a method of manufacturing a three-dimensional flash memory includes: forming a lower channel layer; forming a wiring connector on a portion of a top region of the lower channel layer; forming an insulating layer to cover the wiring connector; etching a portion of the insulating layer, which corresponds to a remaining portion of the top region of the lower channel layer except for the portion thereof where the wiring connector is formed, and a portion of the insulating layer, which corresponds to a portion of a top region of the wiring connector; forming an intermediate wiring layer in a space obtained by etching the portion of the insulating layer, which corresponds to the portion of the top region of the wiring connector; forming a channel connector in a space obtained by etching the portion of the insulating layer, which corresponds to the remaining portion of the top region of the lower channel layer except for the portion thereof where the wiring connector is formed; and forming an upper channel layer on the channel connector, wherein the intermediate wiring layer is capable of being selectively used as one of a source electrode and a drain electrode for a string including the upper channel layer and the lower channel layer.

According to an embodiment of the present disclosure, the forming of the wiring connector may include forming the wiring connector in a space between the string and a neighbor string adjacent to the string.

According to another embodiment of the present disclosure, the intermediate wiring layer may be shared by the string and the neighbor string adjacent to the string.

Advantageous Effects of Disclosure

According to embodiments of the present disclosure, a three-dimensional flash memory device, which has a structure including at least one intermediate wiring layer capable of being reconfigured to be adaptively used as one of a source electrode and a drain electrode, and which allows a bulk erase operation based on a bulk of a substrate to be supported by forming, in the at least one intermediate wiring layer, at least one connector that connects at least two channel layers divided by the at least one intermediate wiring layer to each other, and a method of manufacturing the three-dimensional flash memory device may be provided.

In addition, according to embodiments of the present disclosure, a three-dimensional flash memory device, which includes a channel connector connecting an upper channel layer to a lower channel layer and a wiring connector connecting the channel connector to an intermediate wiring layer, thereby allowing a degree of integration of a structure including the intermediate wiring layer to be improved and a wiring process to be simplified, and a method of manufacturing the three-dimensional flash memory device may be provided.

Accordingly, according to embodiments of the present disclosure, a bulk erase operation may be supported simultaneously with solving drawbacks of existing three-dimensional flash memory devices, such as a reduction in cell current and a deterioration in cell characteristics, and an improvement in the degree of integration and the simplification of the wiring process may be achieved.

Further, according to embodiments of the present disclosure, a three-dimensional flash memory device, which allows integration and size-reduction to be achieved by forming an upper wiring layer, at least one intermediate wiring layer, and a lower wiring layer in an inversely stepwise shape to different extension lengths from each other and thus respectively thereto plugs formed on the same line on a single substrate, and a method of manufacturing the three-dimensional flash memory device may be provided.

BEST MODE

Figure 1:
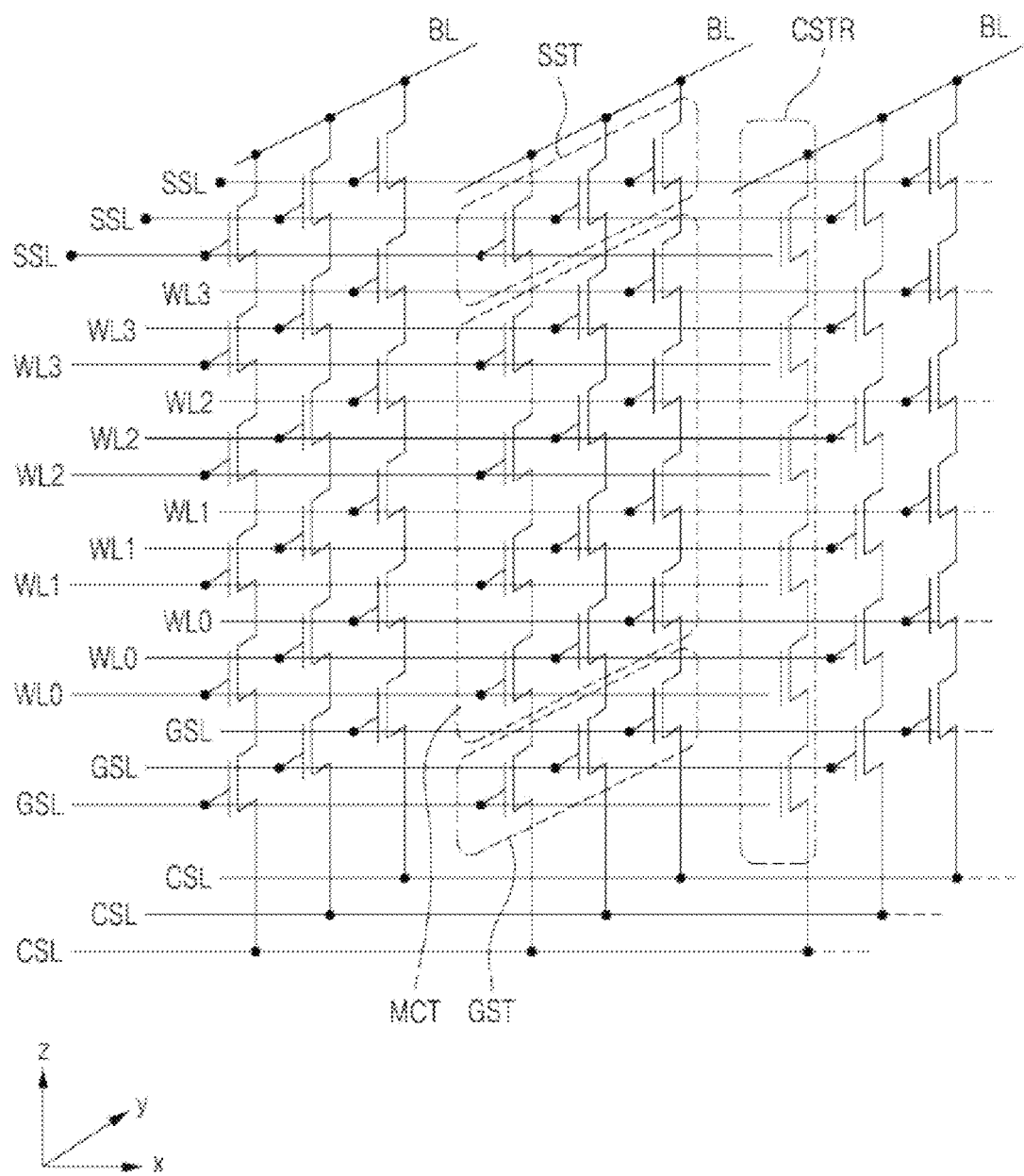
FIG. 1 is a schematic circuit diagram illustrating an array of existing three-dimensional flash memory.

Hereinafter, embodiments of the present disclosure will be described in detail with reference to the accompanying drawings. However, the present disclosure is not limited to the embodiments described herein. In addition, like components will be denoted by like reference numerals throughout the specification.

Further, terms used herein are only for the purpose of properly describing embodiments of the present disclosure and may vary according to users, intentions of operators, custom in the art, or the like. Therefore, the terms used herein should be defined based on descriptions made throughout the specification.

Figure 3:
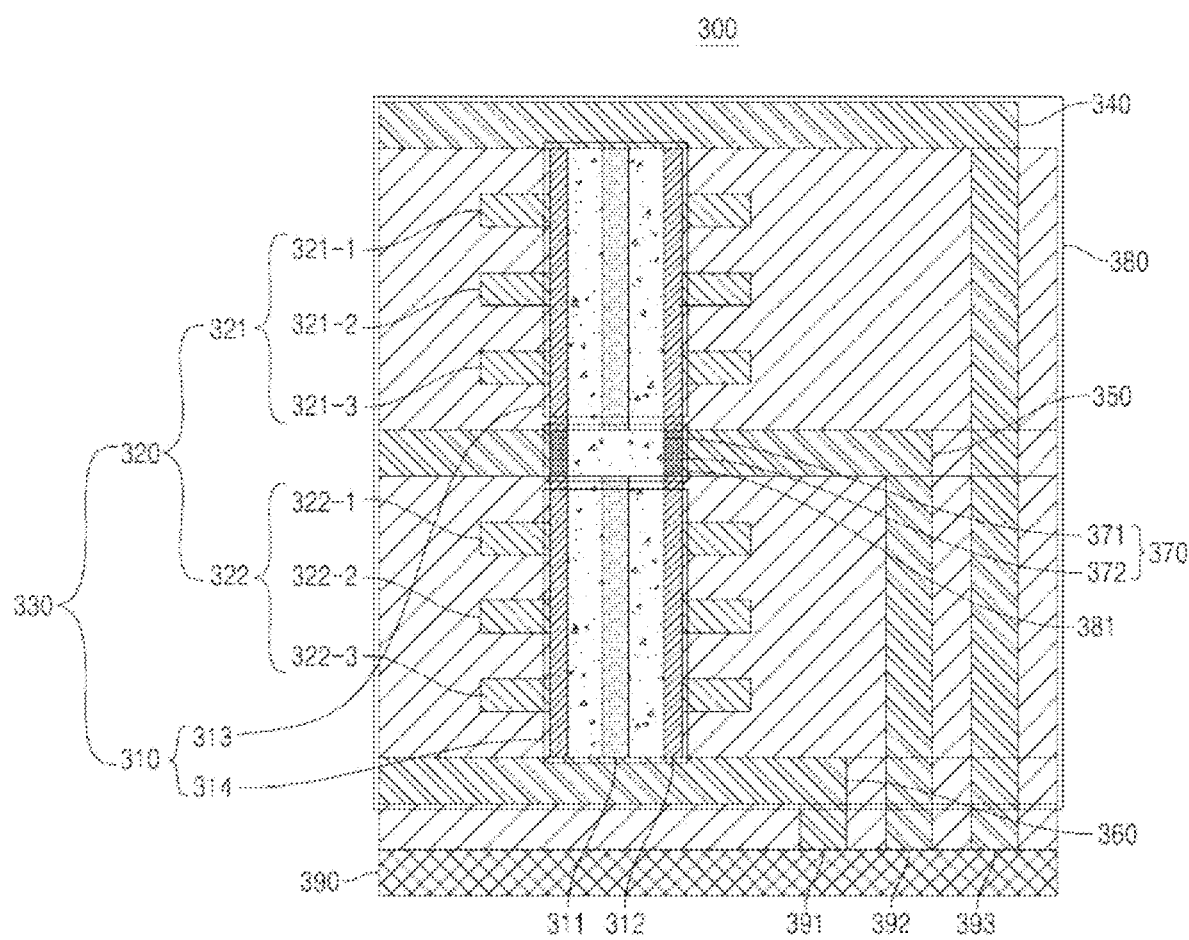
FIG. 3 is a cross-sectional view illustrating a three-dimensional flash memory device supporting a bulk erase operation, according to an embodiment of the present disclosure.
Figure 4:
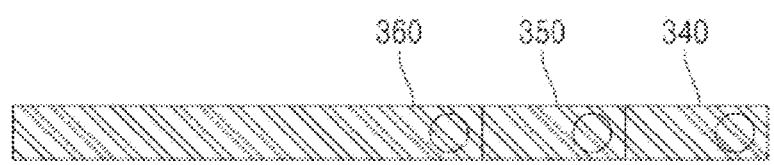
FIG. 4 illustrates a bottom view of a region 380 of the three-dimensional flash memory device of FIG. 3, which supports a bulk erase operation.
Figure 5:
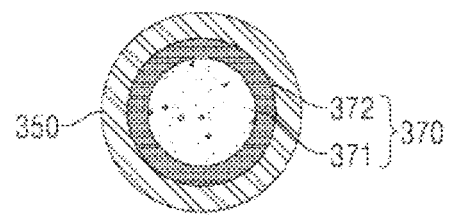
FIG. 5 illustrates a cross-sectional view of a region 381 of the three-dimensional flash memory device of FIG. 3, which supports a bulk erase operation.

FIG. 3 is a cross-sectional view illustrating a three-dimensional flash memory device supporting a bulk erase operation, according to an embodiment of the present disclosure, FIG. 4 illustrates a bottom view of a region 380 of the three-dimensional flash memory device of FIG. 3, which supports a bulk erase operation, and FIG. 5 illustrates a cross-sectional view of a region 381 of the three-dimensional flash memory device of FIG. 3, which supports a bulk erase operation.

Referring to FIG. 3, a three-dimensional flash memory device 300 supporting a bulk erase operation, according to an embodiment of the present disclosure, includes a string 330, which includes a channel layer 310 and a plurality of electrode layers 320 stacked vertically with respect to the channel layer 310, an upper wiring layer 340, at least one intermediate wiring layer 350, a lower wiring layer 360, and at least one connector 370.

Figure 2:
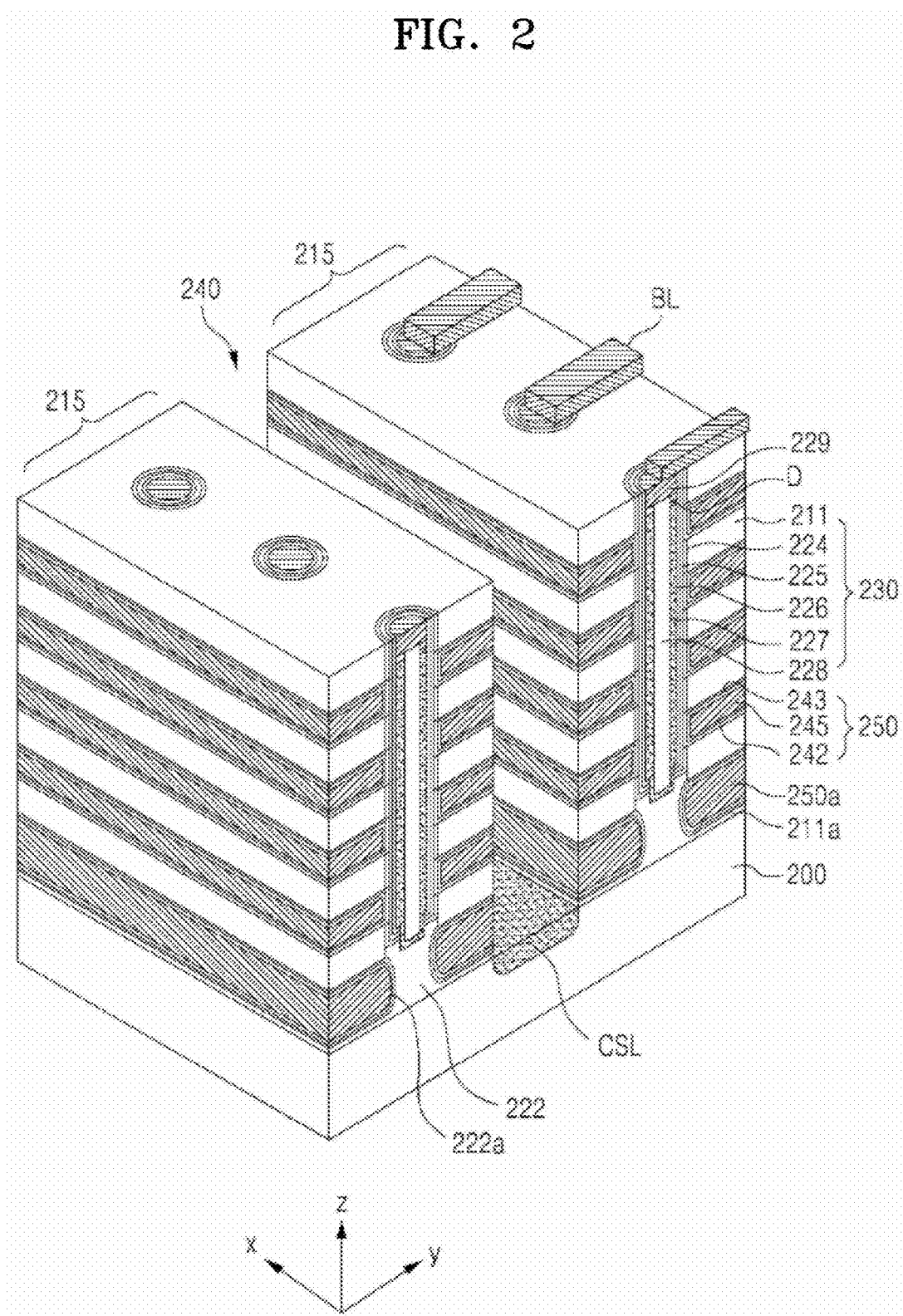
FIG. 2 is a perspective view illustrating a structure of existing three-dimensional flash memory.

Hereinafter, although the three-dimensional flash memory device 300 supporting a bulk erase operation is described as including the above-described components, the present disclosure is not limited thereto, and the three-dimensional flash memory device 300 may further include a charge storage layer (not shown), which connects the channel layer 310 to the plurality of electrode layers 320, and a plurality of interlayer dielectrics (not shown), which are arranged alternately with the plurality of electrode layers 320 and stacked vertically with respect to the channel layer 310. That is, the three-dimensional flash memory device 300 may have a structure further including the existing components described with reference to FIG. 2.

The channel layer 310 extends in one direction. For example, the channel layer 310 may extend in the z-axis direction described with reference to FIG. 2. The channel layer 310 may have a tubular shape having an empty inside, and in this case, a filling film 311 may be further arranged to fill the inside of the channel layer 310, and a sidewall 312 may be further arranged to surround an outside of the channel layer 310.

The plurality of electrode layers 320 are stacked vertically with respect to the channel layer 310. The plurality of electrode layers 320 may extend in the x-axis direction described with reference to FIG. 2.

Here, the plurality of electrode layers 320 may be grouped into at least two blocks 321 and 322 divided by the at least one intermediate wiring layer 350. For example, a first electrode layer 321-1, a second electrode layer 321-2, and a third electrode layer 321-3 may be grouped into a first block 321, and a fourth electrode layer 322-1, a fifth electrode layer 322-2, and a sixth electrode layer 322-3 may be grouped into a second block 322.

The upper wiring layer 340 is arranged on the string 330 (more specifically, the channel layer 310). Here, the upper wiring layer 340 may extend in a direction perpendicular to an extension direction of the plurality of electrode layers 320 (in a direction perpendicular to the extension direction of the plurality of electrode layers 320 in a plan view). That is, the upper wiring layer 340 may extend in the y-axis direction described with reference to FIG. 2.

The at least one intermediate wiring layer 350 is arranged between the plurality of electrode layers 320 through the channel layer 310 in an intermediate region of the string 330. Here, the at least one intermediate wiring layer 350 may extend in the direction perpendicular to the extension direction of the plurality of electrode layers 320 (in the direction perpendicular to the extension direction of the plurality of electrode layers 320 in a plan view). For example, the at least one intermediate wiring layer 350 may extend in the direction (the y-axis direction described with reference to FIG. 2) perpendicular to the extension direction (the x-axis direction described with reference to FIG. 2) of the plurality of electrode layers 320 in a plan view. A pattern in which the at least one intermediate wiring layer 350 is formed will be described in detail with reference to FIGS. 10A and 10B.

The lower wiring layer 360 is arranged under the string 330 (more specifically, the channel layer 310). Here, the lower wiring layer 360 may extend in the direction perpendicular to the extension direction of the plurality of electrode layers 320 (in the direction perpendicular to the extension direction of the plurality of electrode layers 320 in a plan view). That is, the lower wiring layer 360 may extend in the y-axis direction described with reference to FIG. 2.

Each of the upper wiring layer 340, the at least one intermediate wiring layer 350, and the lower wiring layer 360, which have such structures, may be adaptively used as one of a drain electrode and a source electrode in the three-dimensional flash memory device 300. Here, use as a drain electrode may mean use as the bit line BL shown in FIG. 1, and the statement that a wiring layer (for example, 340, 350, or 360) is used as a drain electrode (or a source electrode) may mean that the wiring layer 340, 350, or 360 itself is used as a drain electrode (or a source electrode) as well as mean that an electrode layer directly connected to the wiring layer 340, 350, or 360 is used as a drain electrode (or a source electrode).

For example, when the upper wiring layer 340 is used as a source electrode, the at least one intermediate wiring layer 350, which is closest to the upper wiring layer 340 while a memory cell to be controlled by the at least one intermediate wiring layer 350 and the upper wiring layer 340 is therebetween, may be used as a drain electrode, and when the upper wiring layer 340 is used as a drain electrode, the at least one intermediate wiring layer 350, which is closest to the upper wiring layer 340 while a memory cell to be controlled by the at least one intermediate wiring layer 350 and the upper wiring layer 340 is therebetween, may be used as a source electrode. Hereinafter, the memory cell refers to a charge storage layer, which is an information storage element in the three-dimensional flash memory device 300, and an electrode layer directly contacting the charge storage layer. Because the three-dimensional flash memory device 300 according to an embodiment of the present disclosure includes the plurality of electrode layers 320, the three-dimensional flash memory device 300 may include a plurality of charge storage layers corresponding to the plurality of electrode layers 320 and thus include a plurality of memory cells including the plurality of electrode layers 320 and the plurality of charge storage layers in pairs.

As another example, when the at least one intermediate wiring layer 350 is implemented by a plurality of intermediate wiring layers 350 including a first intermediate wiring layer, a second intermediate wiring layer, and a third intermediate wiring layer (which are sequentially arranged in the stated order in this example), the first intermediate wiring layer may be used as a drain electrode, and thus, the second intermediate wiring layer, which is closest to the first intermediate wiring layer while a memory cell to be controlled by the first intermediate wiring layer and the second intermediate wiring layer is therebetween, may be used as a source electrode. In addition, the third intermediate wiring layer may be used as a source electrode, and thus, the second intermediate wiring layer, which is closest to the third intermediate wiring layer while a memory cell to be controlled by the third intermediate wiring layer and the second intermediate wiring layer is therebetween, may be used as a drain electrode. As such, the second intermediate wiring layer may be used as a source electrode or a drain electrode according to whether another intermediate wiring layer adjacent thereto is used as either a drain electrode or a source electrode.

That is, each of the upper wiring layer 340, the at least one intermediate wiring layer 350, and the lower wiring layer 360, when another wiring layer adjacent thereto and putting a memory cell to be controlled therebetween is used as one of a drain electrode and a source electrode, may be adaptively used as the remaining one other than the one used for the other wiring layer. Hereinafter, use of one wiring layer as a drain electrode or a source electrode according to circumstances means that the corresponding wiring layer is formed in a reconfigurable manner such that the corresponding wiring layer is capable of being adaptively used as one of a source electrode and a drain electrode. Thus, the upper wiring layer 340, the at least one intermediate wiring layer 350, and the lower wiring layer 360 may be formed in a reconfigurable manner.

Here, the upper wiring layer 340, the at least one intermediate wiring layer 350, and the lower wiring layer 360 may be provided to correspond to each of the at least two blocks 321 and 322 into which the plurality of electrode layers 320 are grouped. For example, the upper wiring layer 340 and the at least one intermediate wiring layer 350 may be provided to correspond to the first block 321, into which the first electrode layer 321-1, the second electrode layer 321-2, and the third electrode layer 321-3 are grouped, and may be used as a drain electrode or a source electrode for the first block 321 (the first electrode layer 321-1, the second electrode layer 321-2, and the third electrode layer 321-3), and the at least one intermediate wiring layer 350 and the lower wiring layer 360 may be provided to correspond to the second block 322, into which the fourth electrode layer 322-1, the fifth electrode layer 322-2, and the sixth electrode layer 322-3 are grouped, and may be used as a drain electrode or a source electrode for the second block 322 (the fourth electrode layer 322-1, the fifth electrode layer 322-2, and the sixth electrode layer 322-3). Accordingly, the three-dimensional flash memory device 300 may select and use one of the upper wiring layer 340, the at least one intermediate wiring layer 350, and the lower wiring layer 360 as a drain electrode or a source electrode, thereby selectively programming, erasing, and reading a charge storage layer corresponding to one of electrode layers that use the corresponding wiring layer. Hereinafter, although an example, in which one intermediate wiring layer 350 is provided, is described, the present disclosure is not limited thereto, and a plurality of intermediate wiring layers 350, that is, two or more intermediate wiring layers 350, may be provided. In this case, likewise, each of the plurality of intermediate wiring layers 350 may be arranged between the plurality of electrode layers 320.

Accordingly, the three-dimensional flash memory device 300 according to an embodiment of the present disclosure may reduce a cell current and improve the deterioration in cell characteristics as compared with existing three-dimensional flash memory devices including only one drain electrode on a channel layer.

In addition, extension lengths of the upper wiring layer 340, the at least one intermediate wiring layer 350, and the lower wiring layer 360 may be different from each other. For example, referring to FIG. 4 illustrating a bottom view of the region 380 (FIG. 4 illustrates only the upper wiring layer 340, the at least one intermediate wiring layer 350, and the lower wiring layer 360 except for other components for convenience of description), the upper wiring layer 340, the at least one intermediate wiring layer 350, and the lower wiring layer 360 may sequentially and respectively have decreasing extension lengths toward a bottom of the three-dimensional flash memory device 300. Accordingly, the upper wiring layer 340, the at least one intermediate wiring layer 350, and the lower wiring layer 360 may form an inversely stepwise shape having sequentially decreasing step lengths, in a side view.

In addition, even when a plurality of intermediate wiring layers 350 are provided, likewise, the plurality of intermediate wiring layers 350 may sequentially and respectively have decreasing extension lengths toward the bottom of the three-dimensional flash memory device 300.

Due to such an inversely stepwise shape, the upper wiring layer 340, the at least one intermediate wiring layer 350, and the lower wiring layer 360 may be respectively connected to plugs 393, 392, and 391 formed on the same line on a single substrate 390, and thus, the three-dimensional flash memory device 300 may achieve integration and size-reduction and may reduce a degree of complexity in a wiring process.

The upper wiring layer 340, the at least one intermediate wiring layer 350, and the lower wiring layer 360 may each include at least one of tungsten (W), titanium (Ti), tantalum (Ta), copper (Cu), or gold (Au). However, the present disclosure is not limited thereto, and the upper wiring layer 340, the at least one intermediate wiring layer 350, and the lower wiring layer 360 may each include a metal material, a conductive nonmetal material, or a mixture of a metal material and a nonmetal material.

The at least one connector 370 is formed in the at least one intermediate wiring layer 350 and may connect at least two channel layers 313 and 314 divided by the at least one intermediate wiring layer 350 to each other. For example, the at least one connector 370 may connect the at least two channel layers 313 and 314 to each other while surrounded by the at least one intermediate wiring layer 350. As a more particular example, referring to FIG. 5 illustrating a cross-sectional view of the region 381, the at least one connector 370 may include an N− layer 371 and an N+ layer 372 that surrounds the N− layer 371 and contacts the at least one intermediate wiring layer 350. Here, the N− layer 371 may be formed by a process of implanting N− type ions into the same material as the channel layer 310, and the N+ layer 372 may be formed by a process of implanting N+ type ions into the same material as the channel layer 310.

However, the present disclosure is not limited thereto, and the at least one connector 370 may be formed in various structures. This will be described in detail with reference to FIGS. 7 to 9.

Accordingly, the three-dimensional flash memory device 300, which is manufactured on the substrate 390 including a P type bulk and an N+ contact, may support a bulk-based erase operation by connecting the at least two channel layers 313 and 314 to the bulk via the at least one connector 370. Here, because the bulk-based erase operation is a technique according to the related art, descriptions thereof will be omitted.

Heretofore, although the three-dimensional flash memory device 300 including one string 330 has been described, the three-dimensional flash memory device 300 may include a plurality of strings 330, each having the above-described structure.

Figure 6:
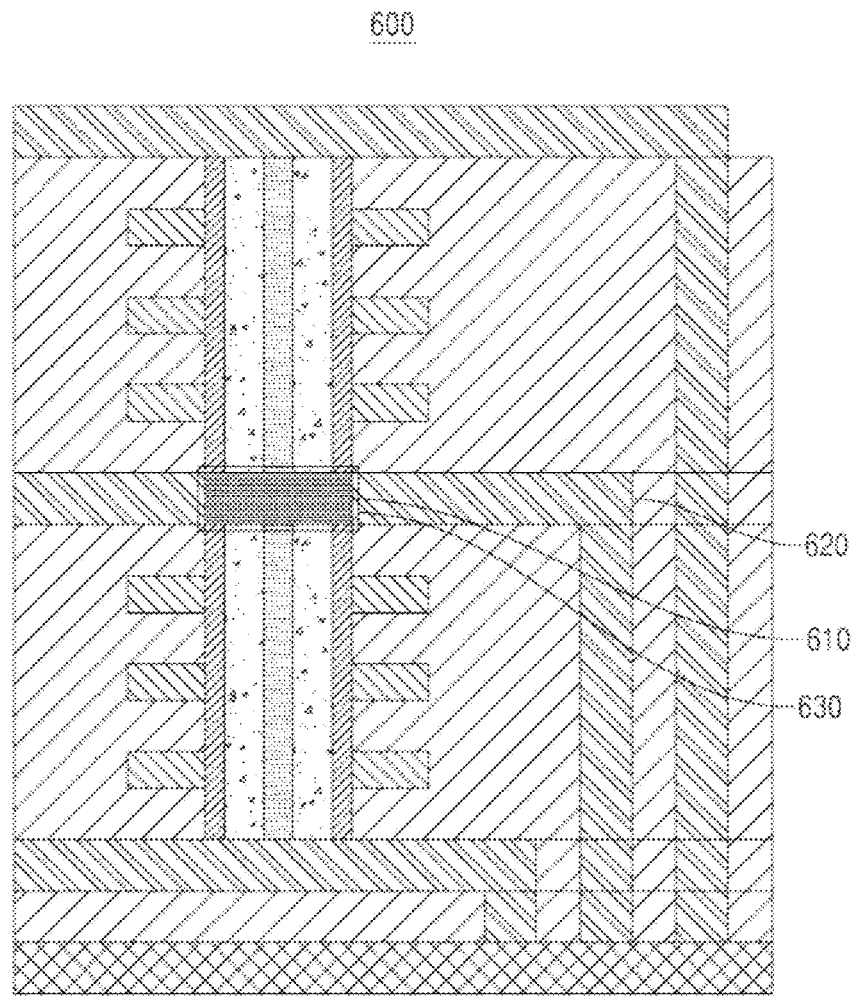
FIG. 6 is a cross-sectional view illustrating a three-dimensional flash memory device supporting a bulk erase operation, according to another embodiment of the present disclosure.
Figure 7:
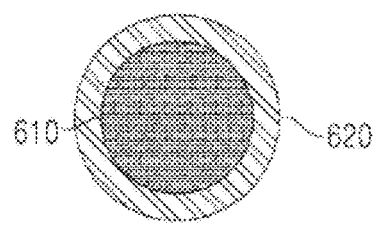
FIG. 7 illustrates a cross-sectional view of a region 630 of the three-dimensional flash memory device of FIG. 6, which supports a bulk erase operation.

FIG. 6 is a cross-sectional view illustrating a three-dimensional flash memory device supporting a bulk erase operation, according to another embodiment of the present disclosure, and FIG. 7 illustrates a cross-sectional view of a region 630 of the three-dimensional flash memory device of FIG. 6, which supports a bulk erase operation.

Referring to FIGS. 6 and 7, while a three-dimensional flash memory device 600 supporting a bulk erase operation, according to another embodiment of the present disclosure, has the same structure as the three-dimensional flash memory device 300 described with reference to FIGS. 3 and 4, at least one connector 610 has a different structure.

For example, in the three-dimensional flash memory device 600 according to another embodiment of the present disclosure, the at least one connector 610 may include an N+ layer surrounded by and contacting at least one intermediate wiring layer 620. Here, the N+ layer may be formed by a process of implanting N+ type ions into the same material as a channel layer.

Figure 8:
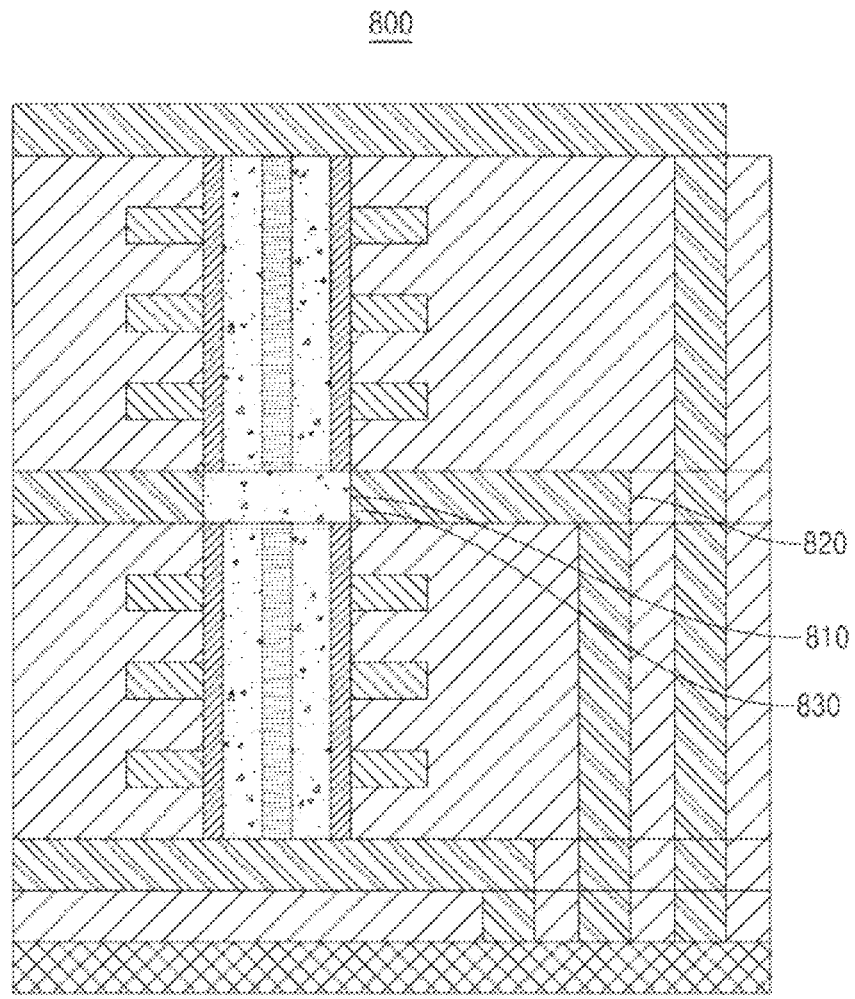
FIG. 8 is a cross-sectional view illustrating a three-dimensional flash memory device supporting a bulk erase operation, according to yet another embodiment of the present disclosure.
Figure 9:
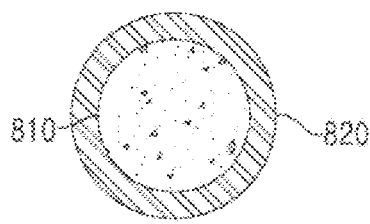
FIG. 9 illustrates a cross-sectional view of a region 830 of the three-dimensional flash memory device of FIG. 8, which supports a bulk erase operation.

FIG. 8 is a cross-sectional view illustrating a three-dimensional flash memory device supporting a bulk erase operation, according to yet another embodiment of the present disclosure, and FIG. 9 illustrates a cross-sectional view of a region 830 of the three-dimensional flash memory device of FIG. 8, which supports a bulk erase operation.

Referring to FIGS. 8 and 9, while a three-dimensional flash memory device 800 supporting a bulk erase operation, according to yet another embodiment of the present disclosure, has the same structure as the three-dimensional flash memory device 300 described with reference to FIGS. 3 and 4, at least one connector 810 has a different structure.

For example, in the three-dimensional flash memory device 800 according to yet another embodiment of the present disclosure, the at least one connector 810 may include an N− layer surrounded by and contacting at least one intermediate wiring layer 820. Here, the N− layer may be formed by a process of implanting N− type ions into the same material as a channel layer.

Heretofore, in the three-dimensional flash memory devices 300, 600, and 800 described with reference to FIGS. 3 to 9, an erase voltage $V_{erase}$ (for example, 14 V) is applied to the bulk included in the substrate and the remaining wiring layers are floating, as shown in the following Table 1, thereby performing a bulk-based erase operation.

TABLE 1

| | |
|---|---|
| Upper wiring layer | 0 V |
| First top selector | 0 V |
| Gate of 1-$1^{st}$ memory cell | 0 V |
| Gate of 1-$2^{nd}$ memory cell | 0 V |
| First bottom selector | 0 V |
| Intermediate wiring layer | Floating |
| Second top selector | 0 V |
| Gate of 2-$1^{st}$ memory cell | 0 V |
| Gate of 2-$2^{nd}$ memory cell | 0 V |
| Second bottom selector | 0 V |
| Lower wiring layer | Floating |
| Third top selector | 0 V |
| Gate of 3-$1^{st}$ memory cell | 0 V |
| Gate of 3-$2^{nd}$ memory cell | 0 V |
| Third bottom selector | 0 V |
| Bulk | $V_{erase}$ (14V) |

Figure 10A:
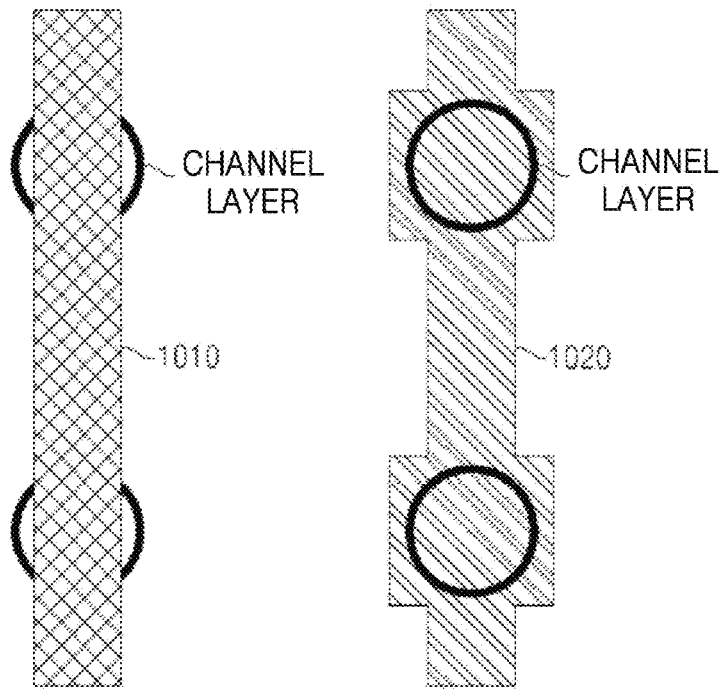
FIGS. 10A and 10B are diagrams each illustrating a pattern in which at least one intermediate wiring layer is formed, in a three-dimensional flash memory device supporting a bulk erase operation, according to an embodiment of the present disclosure.
Figure 10B:
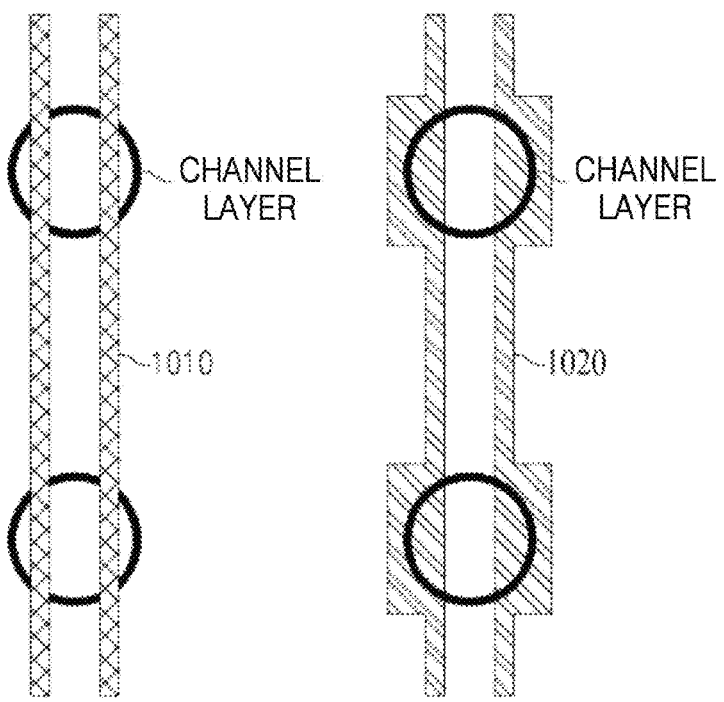

FIGS. 10A and 10B are diagrams each illustrating a pattern in which at least one intermediate wiring layer is formed, in a three-dimensional flash memory device supporting a bulk erase operation, according to an embodiment of the present disclosure.

Referring to FIGS. 10A and 10B, in the three-dimensional flash memory device supporting a bulk erase operation, a pattern in which at least one intermediate wiring layer 1020 is formed may be determined according to a shape of a bit line connected to the three-dimensional flash memory device. More specifically, the at least one intermediate wiring layer 1020 may be formed in a pattern according to a shape of a bit line connected to a string that corresponds to the at least one intermediate wiring layer 1020.

For example, as shown in FIG. 10A illustrating top views, when a bit line 1010 is formed as a single line having a filled inside, the at least one intermediate wiring layer 1020 may be formed as a single line having a filled inside according to the shape of the bit line 1010.

As another example, as shown in FIG. 10B illustrating top views, when the bit line 1010 is formed as two lines having an empty space therebetween, the at least one intermediate wiring layer 1020 may be formed as two lines having an empty space therebetween according to the shape of the bit line 1010.

Heretofore, although the three-dimensional flash memory device supporting a bulk erase operation has been described, at least one connector may also be implemented to support a gate induced drain leakage (GIDL)-based erase operation rather than a bulk erase operation. This will be described below in detail.

FIGS. 11A to 11D are cross-sectional views illustrating three-dimensional flash memory devices supporting a GIDL erase operation, according to an embodiment of the present disclosure.

Referring to FIGS. 11A to 11D, while a three-dimensional flash memory device 1100 supporting a GIDL-based erase operation has the same structure and components as the three-dimensional flash memory device 300 described with reference to FIG. 3, at least one connector 1110 has a different structure.

Figure 11A:
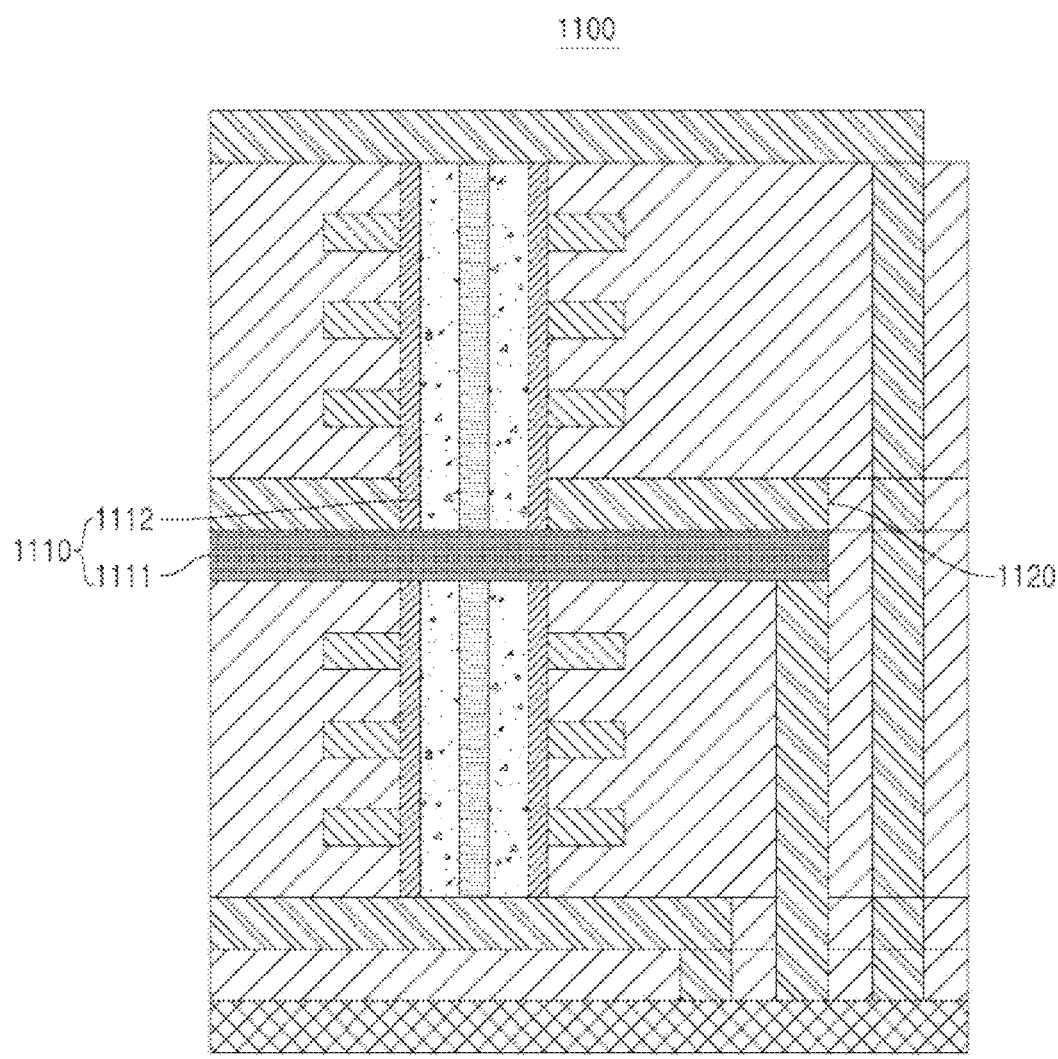
FIGS. 11A to 11E are cross-sectional views illustrating three-dimensional flash memory devices supporting a GIDL erase operation, according to an embodiment of the present disclosure.
Figure 11B:
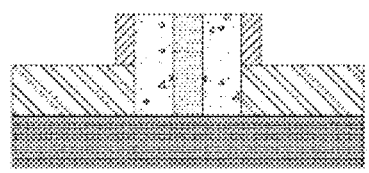

For example, as shown in FIG. 11A, the at least one connector 1110 may be formed in a structure including an N+ layer 1111, which is deposited under at least one intermediate wiring layer 1120, and an N− layer 1112, which is arranged on the N+ layer 1111 and contacts the at least one intermediate wiring layer 1120 while surrounded by the at least one intermediate wiring layer 1120. The N− layer 1112, like a channel layer, may include a filling film filling an inside of the N− layer 1112 and a sidewall surrounding an outside of the N− layer 1112. As a more particular example, as shown in FIG. 11A, although the N− layer 1112 may include both the filling film filling the inside of the N− layer 1112 and the sidewall (for example, an ONO layer) surrounding the outside of the N− layer 1112, the present disclosure is not limited thereto, and as shown in FIG. 11B, the N− layer 1112 may include only the filling film filling the inside of the N− layer 1112. In this case, the sidewall may be formed only up to a top of the at least one intermediate wiring layer 1120.

Figure 11C:
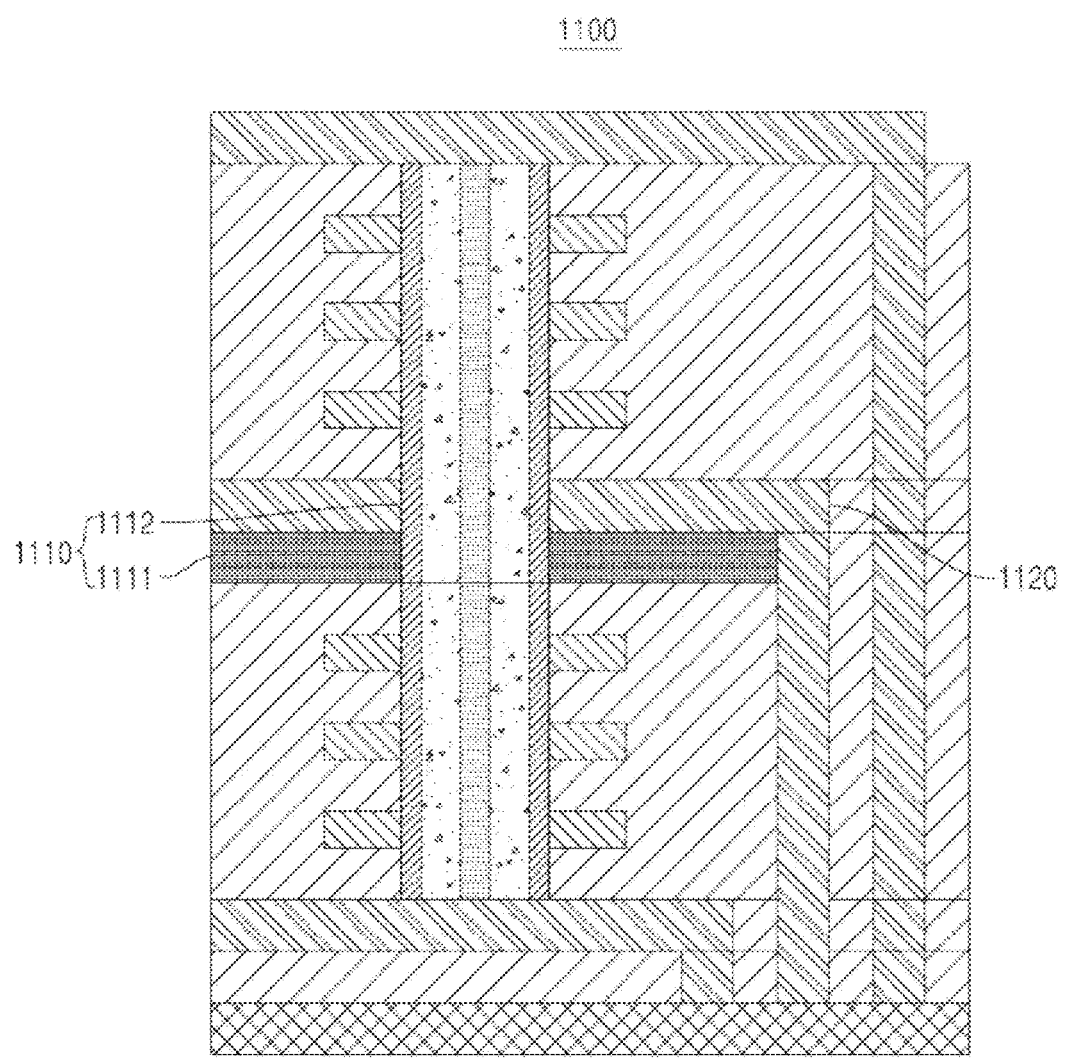
Figure 11D:
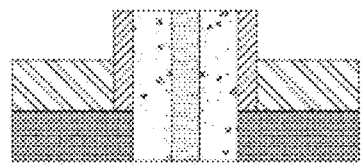
Figure 11E:
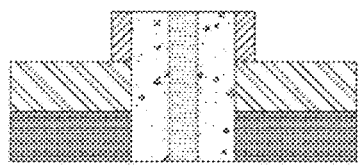

As another example, as shown in FIG. 11C, the at least one connector 1110 may be formed in a structure including the N+ layer 1111, which is deposited under the at least one intermediate wiring layer 1120, and the N− layer 1112, which is surrounded by and contacts both the N+ layer 1111 and the at least one intermediate wiring layer 1120. The N− layer 1112, like the channel layer, may include a filling film filling the inside of the N− layer 1112 and a sidewall surrounding the outside of the N− layer 1112. As a more particular example, as shown in FIG. 11C, although the N− layer 1112 may include both the filling film filling the inside of the N-layer 1112 and the sidewall (for example, an ONO layer) surrounding the outside of the N− layer 1112, the present disclosure is not limited thereto, and the N− layer 1112 may include only the filling film filling the inside of the N− layer 1112. In this case, the sidewall may be formed only down to a top of the N+ layer 1111 as shown in FIG. 11D or may be formed only down to the top of the at least one intermediate wiring layer 1120 as shown in FIG. 11E.

That is, the at least one connector 1110 described with reference to FIGS. 11A to 11D may be formed in various structures under the condition that the N− layer 1112 contacts the N+ layer 1111.

Here, when an existing structure, in which the N+ layer 1111 is deposited on the at least one intermediate wiring layer 120, is provided, a thermal treatment process using annealing needs to be necessarily performed, and thus, there may be an issue of deterioration or loss of the at least one intermediate wiring layer 1120. Accordingly, the three-dimensional flash memory device 1100 according to an embodiment of the present disclosure may implement the at least one connector 1110 and the at least one intermediate wiring layer 1120 in the above-described structures, thereby preventing the deterioration or loss of the at least one intermediate wiring layer 1120.

The three-dimensional flash memory device 1100 including the at least one connector 1110 may support a GIDL-based erase operation rather than a bulk-based erase operation. More specifically, the three-dimensional flash memory device 1100 may perform a GIDL-based erase operation by applying the erase voltage $V_{erase}$ (for example, 14 V) to an upper wiring layer, the at least one intermediate wiring layer 1120, and a lower wiring layer, as shown in the following Table 2.

TABLE 2

| | |
|---|---|
| Upper wiring layer | $V_{erase}$ (14V) |
| First top selector | 0 V |
| Gate of 1-$1^{st}$ memory cell | 0 V |
| Gate of 1-$2^{nd}$ memory cell | 0 V |
| First bottom selector | 0 V |
| Intermediate wiring layer | $V_{erase}$ (14V) |
| Second top selector | 0 V |
| Gate of 2-$1^{st}$ memory cell | 0 V |
| Gate of 2-$2^{nd}$ memory cell | 0 V |
| Second bottom selector | 0 V |
| Lower wiring layer | $V_{erase}$ (14V) |
| Third top selector | 0 V |
| Gate of 3-$1^{st}$ memory cell | 0 V |
| Gate of 3-$2^{nd}$ memory cell | 0 V |
| Third bottom selector | 0 V |
| Bulk | $V_{erase}$ (14V) |

Figure 12:
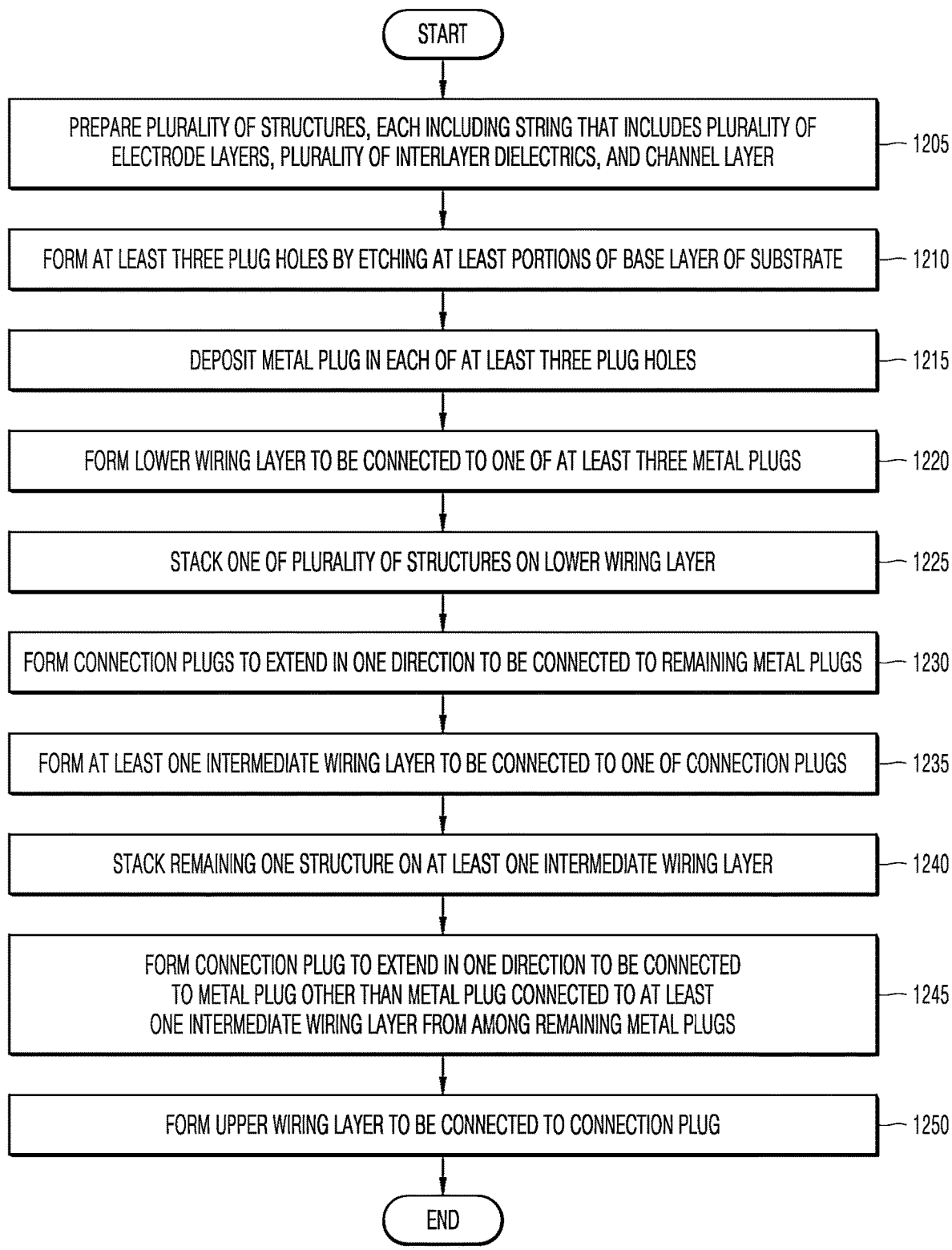
FIG. 12 is a flowchart illustrating a method of manufacturing a three-dimensional flash memory device, according to an embodiment of the present disclosure.

FIG. 12 is a flowchart illustrating a method of manufacturing a three-dimensional flash memory device, according to an embodiment of the present disclosure, and FIGS. 13 to 22 are diagrams illustrating the method of manufacturing the three-dimensional flash memory device, according to an embodiment of the present disclosure.

Referring to FIGS. 12 to 22, the method of manufacturing the three-dimensional flash memory device, according to an embodiment of the present disclosure, is performed by a three-dimensional flash memory manufacturing system (which will be referred to as a manufacturing system hereinafter), and the three-dimensional flash memory device manufactured by the manufacturing method has the structure described with reference to FIG. 3, 6, or 8 or the structure described with reference to FIGS. 11A to 11D.

Figure 13:
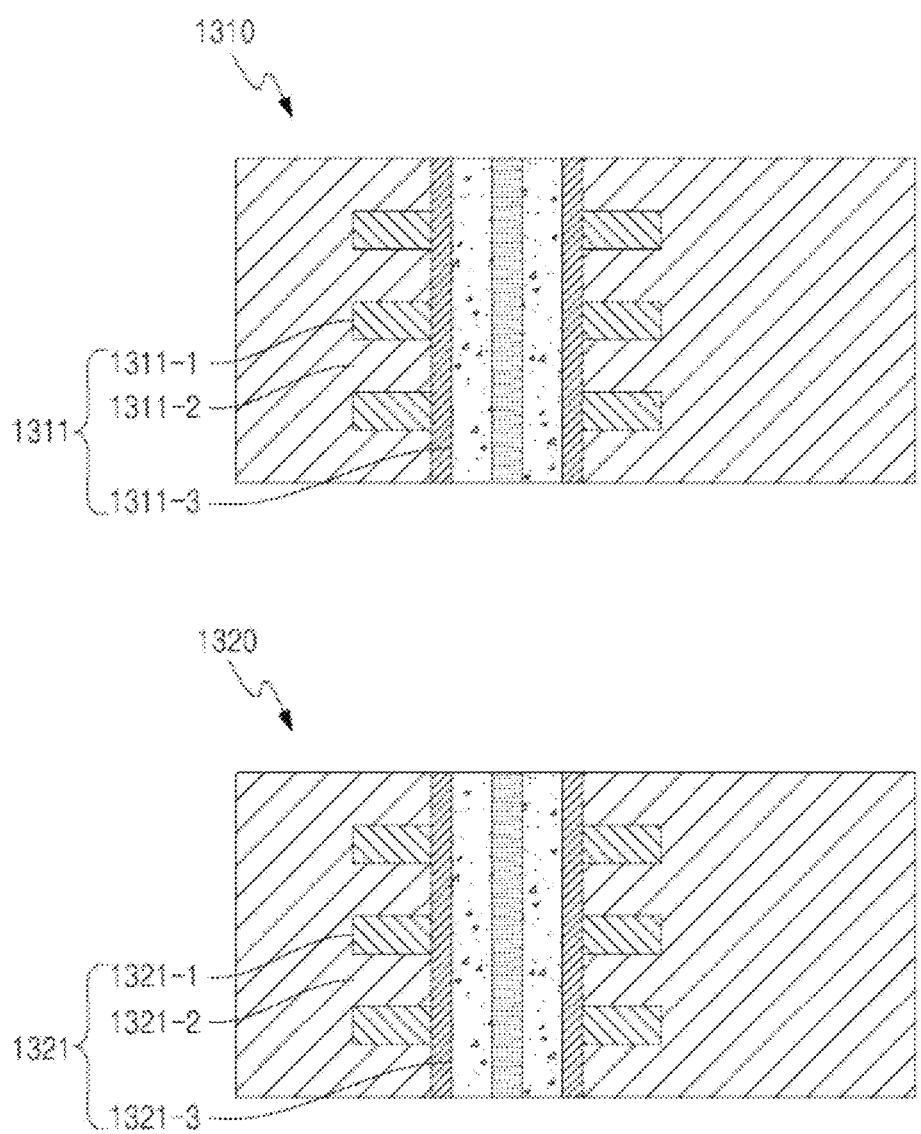
FIGS. 13 to 22 are diagrams illustrating a method of manufacturing a three-dimensional flash memory device, according to an embodiment of the present disclosure.

First, the manufacturing system prepares a plurality of structures, each including a string, the string including a plurality of electrode layers and a plurality of interlayer dielectrics, which are alternately stacked, and a channel layer extending in one direction through the plurality of electrode layers and the plurality of interlayer dielectrics (1205). For example, by the manufacturing system, after a plurality of electrode layers 1311-1 and 1321-1 and a plurality of interlayer dielectrics 1311-2 and 1321-2 are alternately stacked to extend in one direction (the x-axis direction described with reference to FIG. 2) as shown in FIG. 13, a string hole is formed to extend in one direction (the z-axis direction described with reference to FIG. 2) through the plurality of electrode layers 1311-1 and 1321-1 and the plurality of interlayer dielectrics 1311-2 and 1321-2, which are alternately stacked, and channel layers 1311-3 and 1321-3 are formed in the string hole, thereby fabricating and preparing a plurality of structures 1310 and 1320 respectively including strings 1311 and 1321 formed therein.

Figure 14:
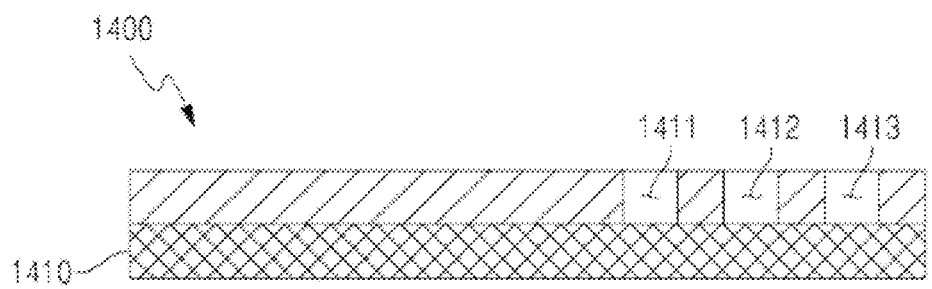

Next, by the manufacturing system, at least three plug holes 1411, 1412, and 1413 are formed by at least partially etching a base layer 1410 of a substrate 1400, as shown in FIG. 14 (1210). Here, by the manufacturing system, the at least three plug holes 1411, 1412, and 1413 may be formed on the same line on the substrate 1400.

Figure 15:
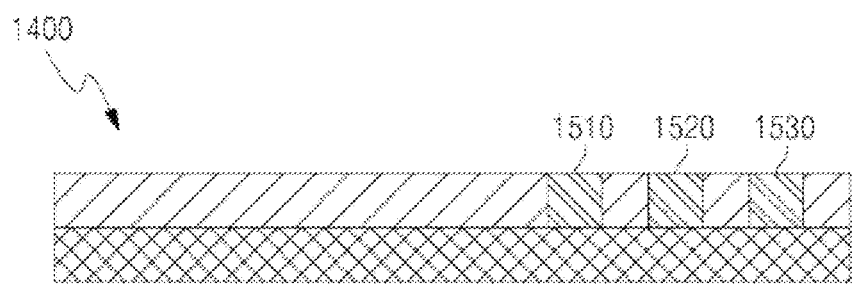

Next, by the manufacturing system, metal plugs 1510, 1520, and 1530 are respectively deposited in the at least three plug holes 1411, 1412, and 1413, as shown in FIG. 15 (1215). Here, because the at least three plug holes 1411, 1412, and 1413 are formed on the same line on the substrate 1400, the metal plugs 1510, 1520, and 1530 deposited in the at least three plug holes 1411, 1412, and 1413 are also located on the same line on the substrate 1400.

Figure 16:
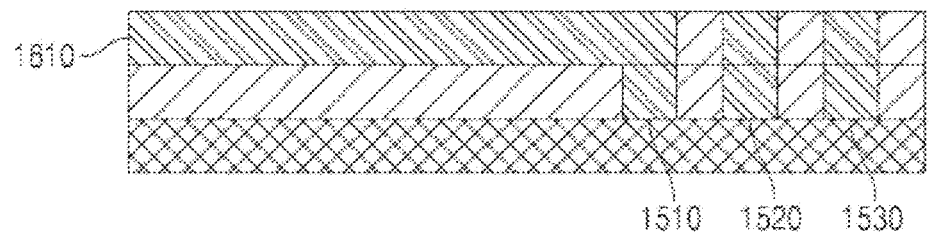

Next, by the manufacturing system, a lower wiring layer is formed to be connected to one of the at least three metal plugs 1510, 1520, and 1530 (1220). For example, by the manufacturing system, a lower wiring layer 1610 may be formed to extend in one direction (the y-axis direction described with reference to FIG. 2) to be connected to a first metal plug 1510 from among the first metal plug 1510, a second metal plug 1520, and a third metal plug 1530, as shown in FIG. 16.

Figure 17:
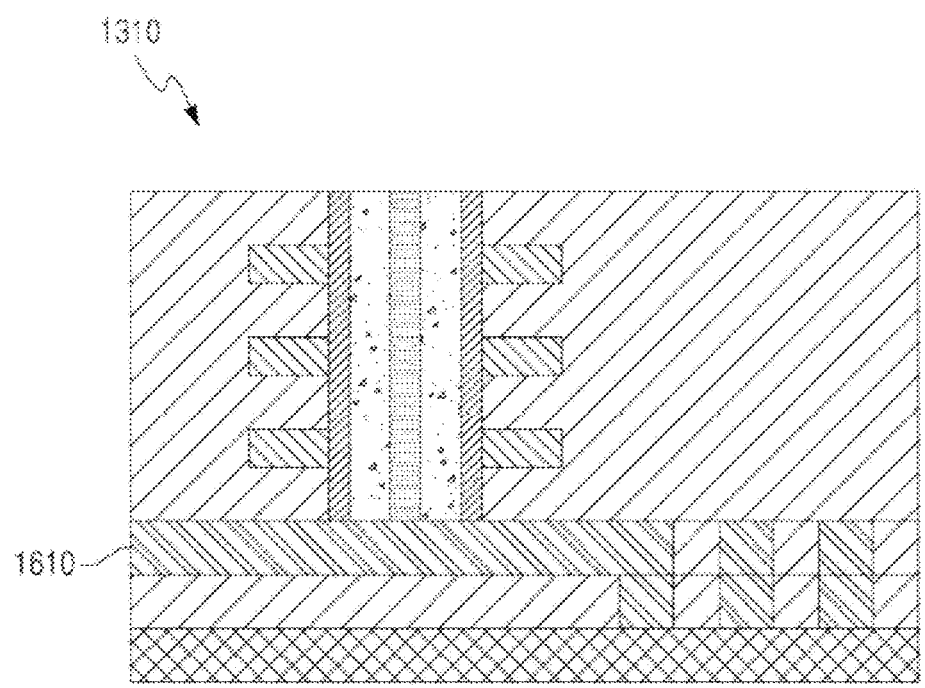

Next, by the manufacturing system, one structure 1310 out of the plurality of structures 1310 and 1320 is stacked on the lower wiring layer 1610 (1225). For example, by the manufacturing system, a first structure 1310 out of the plurality of structures 1310 and 1320 prepared as shown in FIG. 13 may be stacked on the lower wiring layer 1610, as shown in FIG. 17.

Figure 18:
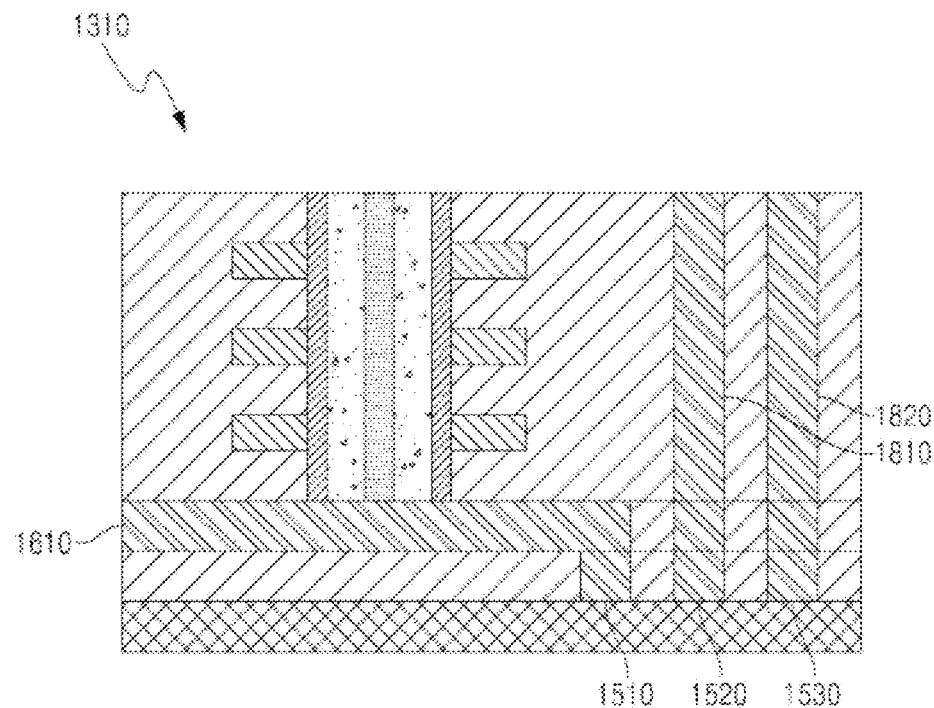

Next, by the manufacturing system, connection plugs are formed in the one structure 1310, which is stacked on the lower wiring layer 1610, to extend in one direction, the connection plugs being respectively connected to the remaining metal plugs 1520 and 1530 except for the one metal plug 1510 from among the at least three metal plugs 1510, 1520, and 1530 (1230). For example, by the manufacturing system, connection plugs 1810 and 1820 may be formed in the first structure 1310 to extend in one direction (the z-axis direction described with reference to FIG. 2), the connection plugs 1810 and 1820 being respectively connected to the remaining metal plugs 1520 and 1530 except for the first metal plug 1510 connected to the lower wiring layer 1610 from among the first metal plug 1510, the second metal plug 1520, and the third metal plug 1530, as shown in FIG. 18.

Figure 19:
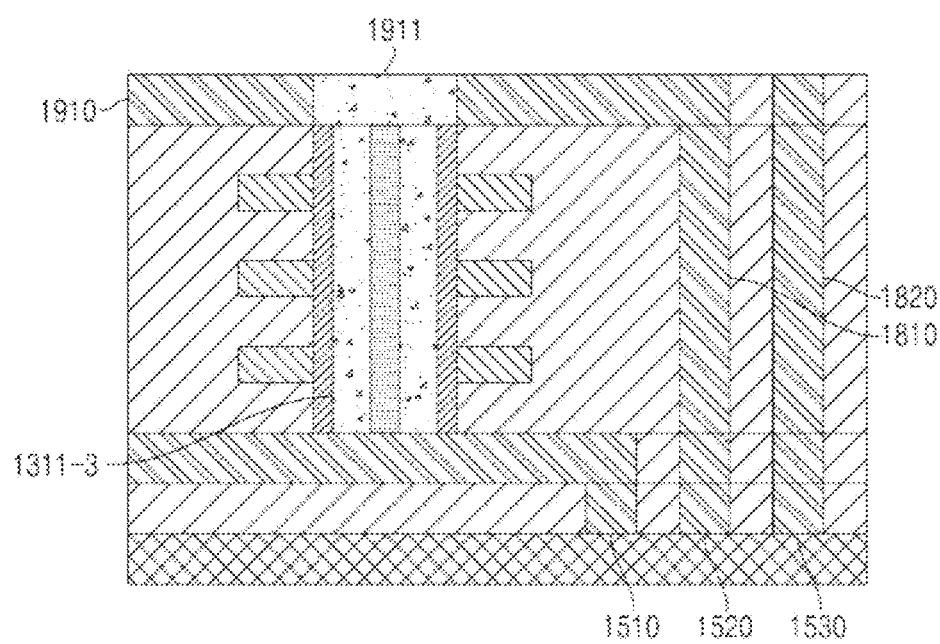

Next, by the manufacturing system, at least one intermediate wiring layer is formed to be connected to one connection plug 1810 out of the connection plugs 1810 and 1820 (1235). For example, by the manufacturing system, at least one intermediate wiring layer 1910 may be formed to extend in one direction (the y-axis direction described with reference to FIG. 2) to be connected to a first connection plug 1810 out of the first connection plug 1810 and a second connection plug 1820, as shown in FIG. 19.

Here, by the manufacturing system, at least one connector may be formed in the at least one intermediate wiring layer 1910 in operation 1235. Specifically, by the manufacturing system, at least one connector 1911 may be formed in the at least one intermediate wiring layer 1910, the at least one connector 1911 connecting the channel layer 1311-3, which is included in the one structure 1310 located under the at least one intermediate wiring layer 1910, to the channel layer 1321-3, which is included in the remaining one structure 1320 to be located on the at least one intermediate wiring layer 1910.

In particular, according to a structure of the at least one connector formed in the at least one intermediate wiring layer 1910 by the manufacturing system in operation 1235, the manufactured three-dimensional flash memory device may be allowed to support one of a bulk-based erase operation and a GIDL-based erase operation. This will be described in detail with reference to FIGS. 23 to 27.

In addition, by the manufacturing system, the at least one intermediate wiring layer 1910 may be formed in a pattern according to a shape of a bit line connected to a string, in operation 1235.

Figure 20:
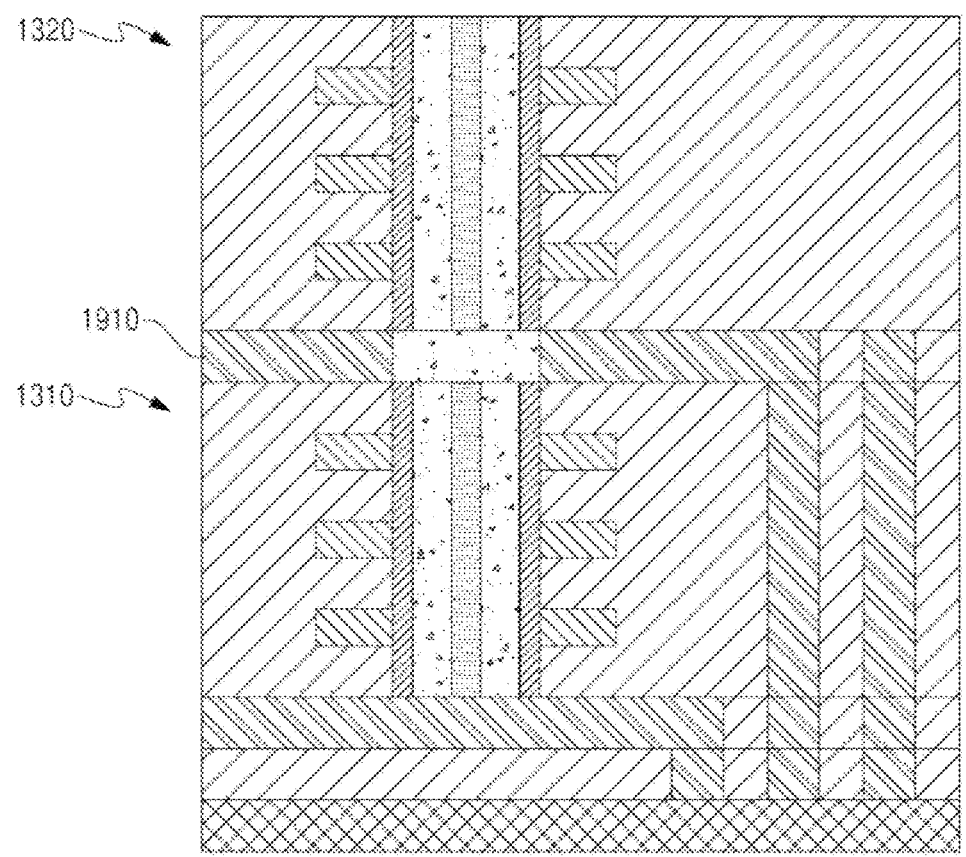

Next, by the manufacturing system, the remaining one structure 1320 except for the structure 1310 stacked on the lower wiring layer 1610, out of the plurality of structures 1310 and 1320, is stacked on the at least one intermediate wiring layer 1910 (1240). For example, by the manufacturing system, a second structure 1320 out of the plurality of structures 1310 and 1320 prepared as shown in FIG. 13 may be stacked on the at least one intermediate wiring layer 1910, as shown in FIG. 20.

Figure 21:
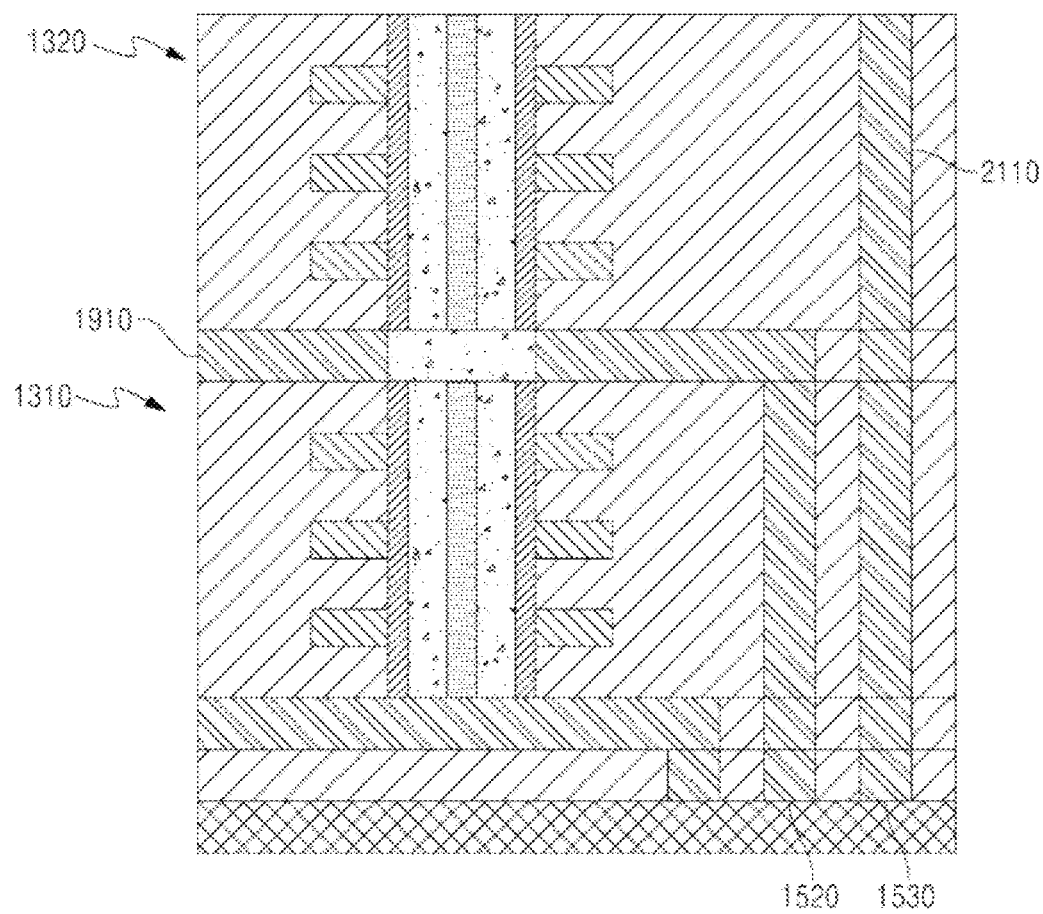

Next, by the manufacturing system, a connection plug is formed in the remaining one structure 1320, which is stacked on the at least one intermediate wiring layer 1910, to extend in one direction, the connection plug being connected to the metal plug 1530 other than the metal plug 1520 connected to the at least one intermediate wiring layer 1910, out of the remaining metal plugs 1520 and 1530. For example, by the manufacturing system, a connection plug 2110 may be formed to extend in one direction (the z-axis direction described with reference to FIG. 2), the connection plug 2110 being connected to the third metal plug 1530 other than the second metal plug 1520 connected to the at least one intermediate wiring layer 1910, out of the second metal plug 1520 and the third metal plug 1530, as shown in FIG. 21.

Figure 22:
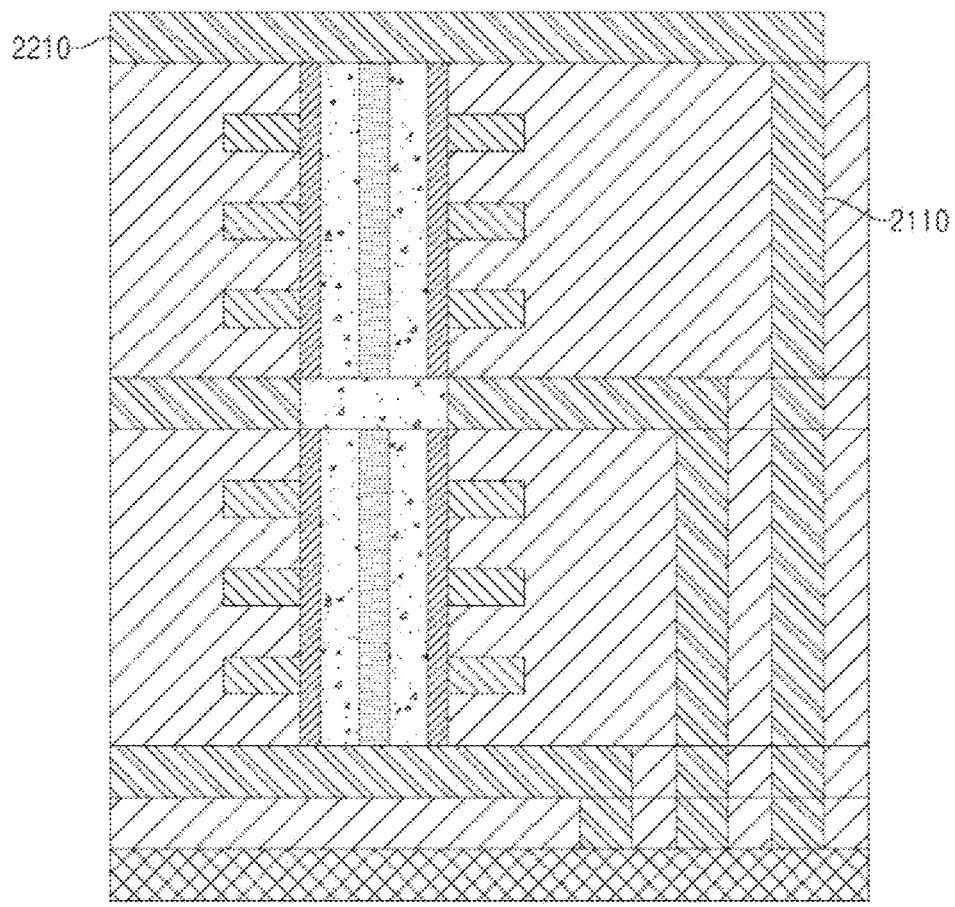

Next, by the manufacturing system, an upper wiring layer is formed to be connected to the connection plug 2110 (1250). For example, by the manufacturing system, an upper wiring layer 2210 may be formed to extend in one direction (the y-axis direction described with reference to FIG. 2) to be connected to the connection plug 2110, as shown in FIG. 22.

In particular, the manufacturing system may allow the lower wiring layer 1610, the at least one intermediate wiring layer 1910, and the upper wiring layer 2210 to form an inversely stepwise shape by forming the lower wiring layer 1610 in operation 1220, the at least one intermediate wiring layer 1910 in operation 1235, and the upper wiring layer 2210 in operation 1250 to different extension lengths from each other. As an example, the manufacturing system may allow the upper wiring layer 2210, the at least one intermediate wiring layer 1910, and the lower wiring layer 1610 to respectively have decreasing extension lengths in the stated order by forming the lower wiring layer 1610 to a smallest extension length, forming the at least one intermediate wiring layer 1910 to a next smallest extension length, and forming the upper wiring layer 2210 to a largest extension length.

Due to the inversely stepwise shape, the upper wiring layer 2210, the at least one intermediate wiring layer 1910, and the lower wiring layer 1610 are respectively connected to the plugs 1413, 1412, and 1411 formed on the same line on the single substrate 1400, whereby the manufactured three-dimensional flash memory device may be integrated and reduced in size and may be manufactured through a simple wiring process having an extremely low degree of complexity as described above.

Heretofore, although the method of manufacturing the three-dimensional flash memory device including one intermediate wiring layer 1910 has been described, the three-dimensional flash memory device may also be manufactured based on the above-described operations even when the three-dimensional flash memory device includes a plurality of intermediate wiring layers 1910.

FIGS. 23 to 27 are diagrams illustrating detailed processes of a process of forming at least one connector in a method of manufacturing a three-dimensional flash memory device, according to an embodiment of the present disclosure.

The manufacturing system may perform a process of forming the at least one connector 1911 in the at least one intermediate wiring layer 1910 through detailed processes as in the following examples. However, a fabrication process of the at least one connector 1911 is not limited to the following examples and may be performed through various processes allowing the at least one connector 1911 to have a structure for connecting the channel layer 1311-3 to the channel layer 1321-3 while the at least one connector 1911 is arranged in the at least one intermediate wiring layer 1910, the channel layer 1311-3 being included in the one structure 1310 located under the at least one intermediate wiring layer 1910, and the channel layer 3121-3 being included in the remaining one structure 1320 that is to be located on the at least one intermediate wiring layer 1910. Such a structure is for allowing a bulk-based erase operation to be supported due to the at least one connector 1911 and will be described with reference to FIGS. 23 to 26.

Figure 23:
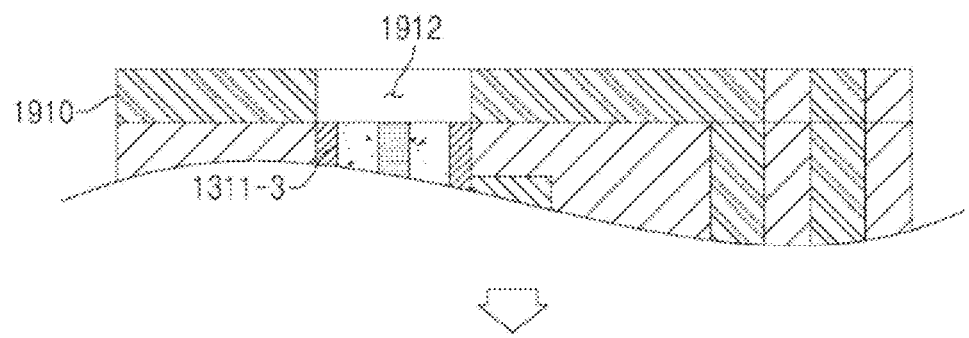
FIGS. 23 to 27 are diagrams illustrating detailed processes of a process of forming at least one connector in a method of manufacturing a three-dimensional flash memory device, according to an embodiment of the present disclosure.
Figure 23:
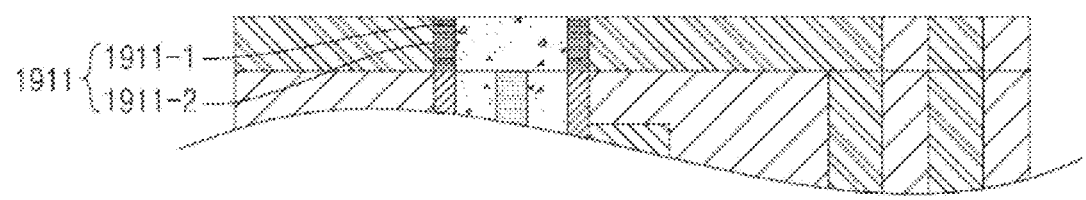

As an example, referring to FIG. 23, by the manufacturing system, after a region 1912 of the at least one intermediate wiring layer 1910, which contacts the channel layer 1311-3 included in the one structure 1310 under the at least one intermediate wiring layer 1910, is etched, the at least one connector 1911, which includes an N− layer 1911-1 and an N+ layer 1911-2 surrounding the N− layer 1911-1 and contacting the at least one intermediate wiring layer 1910, may be formed in the etched region 1912.

Figure 24:
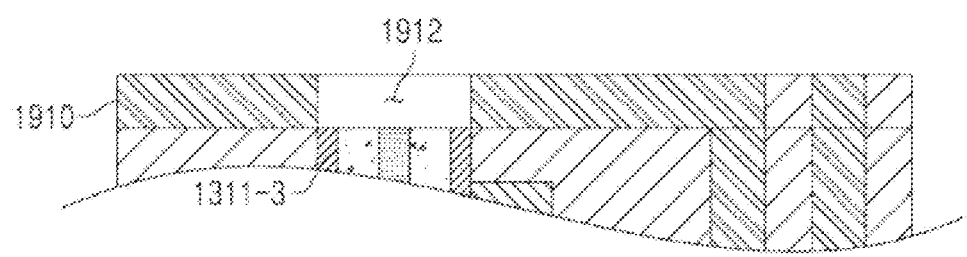
Figure 24:
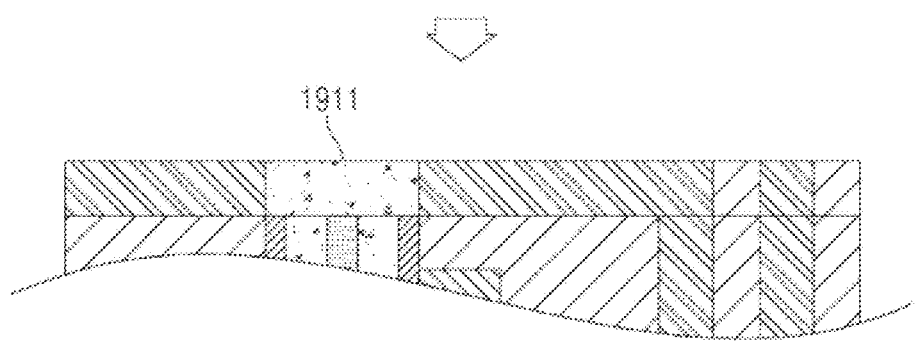

As another example, referring to FIG. 24, by the manufacturing system, after the region 1912 of the at least one intermediate wiring layer 1910, which contacts the channel layer 1311-3 included in the one structure 1310 under the at least one intermediate wiring layer 1910, is etched, the at least one connector 1911, which includes an N− layer surrounded by and contacting the at least one intermediate wiring layer 1910, may be formed in the etched region 1912.

Figure 25:
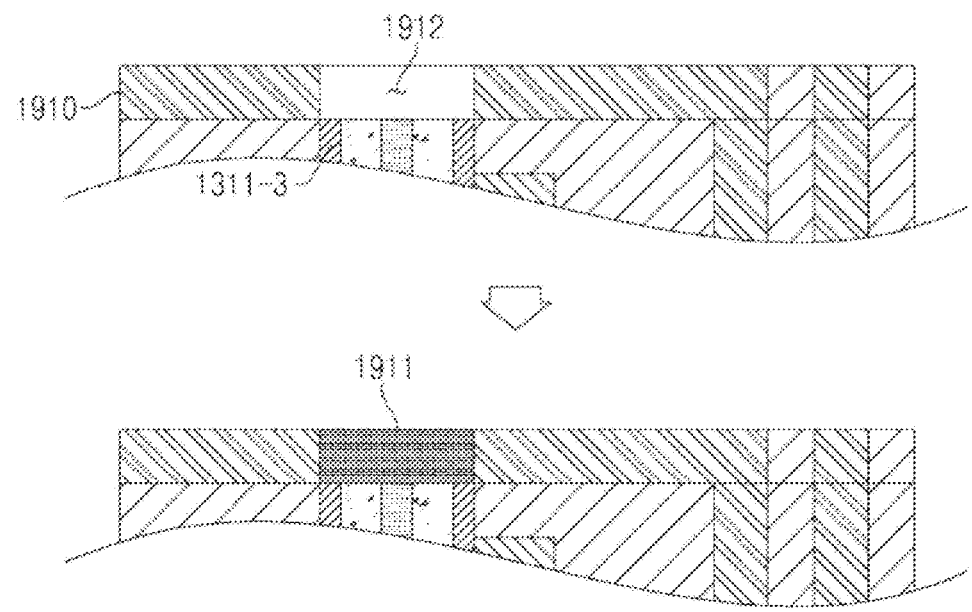

As yet another example, referring to FIG. 25, by the manufacturing system, after the region 1912 of the at least one intermediate wiring layer 1910, which contacts the channel layer 1311-3 included in the one structure 1310 under the at least one intermediate wiring layer 1910, is etched, the at least one connector 1911, which includes an N+ layer surrounded by and contacting the at least one intermediate wiring layer 1910, may be formed in the etched region 1912.

On the other hand, at least one connector 2610 described below with reference to FIGS. 26 and 27 may be fabricated in a structure allowing a three-dimensional flash memory device to support a GIDL-based erase operation, as described in the following examples.

Figure 26:
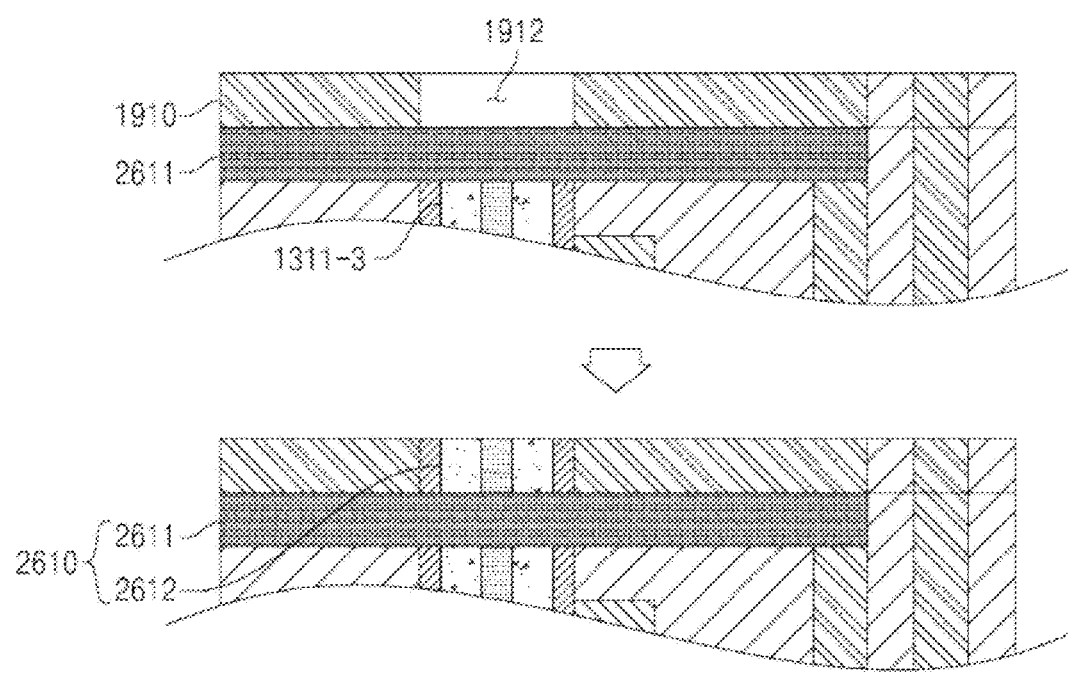

As an example, referring to FIG. 26, by the manufacturing system, after the at least one intermediate wiring layer 1910, under which an N+ layer 2611 is deposited, is formed, the region 1912 of the at least one intermediate wiring layer 1910, which contacts the channel layer 1311-3 included in the one structure 1310 under the at least one intermediate wiring layer 1910, is etched, and then, an N− layer 2612 surrounded by and contacting the at least one intermediate wiring layer 1910 is formed in the etched region 1912, thereby forming the at least one connector 2610.

Figure 27:
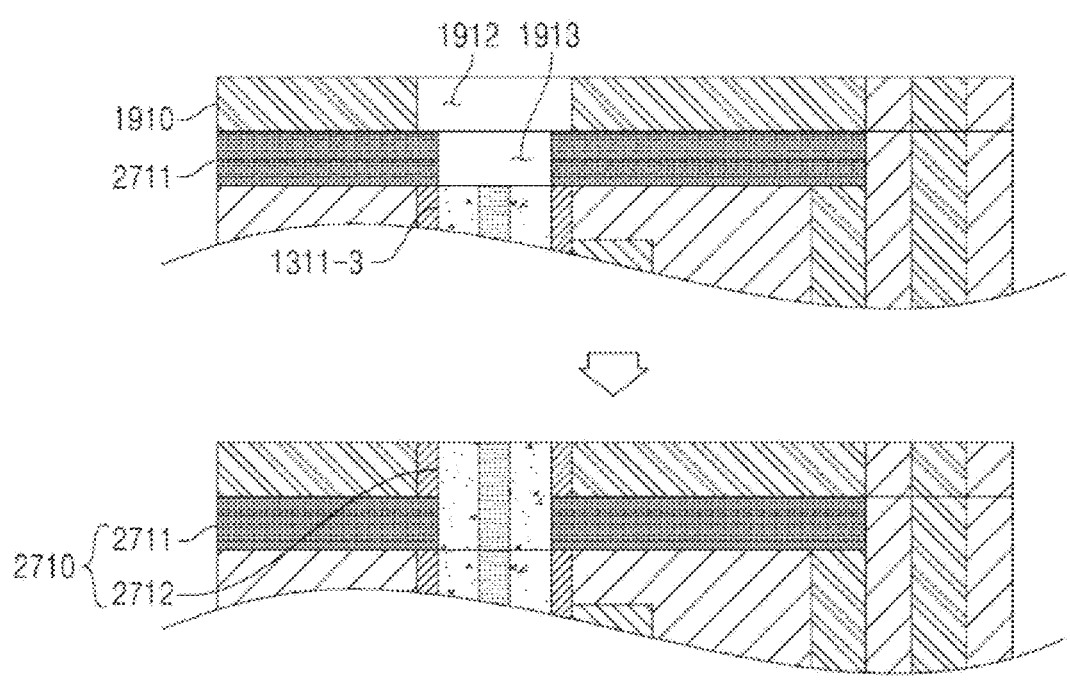

As another example, as shown in FIG. 27, by the manufacturing system, after the at least one intermediate wiring layer 1910, under which an N+ layer 2711 is deposited, is formed, respective regions 1912 and 1913 of the at least one intermediate wiring layer 1910 and the N+ layer 2711, which correspond to the channel layer 1311-3 included in the one structure 1310 under the at least one intermediate wiring layer 1910, are etched, and then, an N− layer 2712 surrounded by and contacting both the N+ layer 2711 and the at least one intermediate wiring layer 1910 is formed in the etched regions 1912 and 1913, thereby forming at least one connector 2710.

Accordingly, the three-dimensional flash memory device may support a GIDL-based erase operation due to the at least one connector 2610 or 2710 formed in such a structure.

Figure 28:
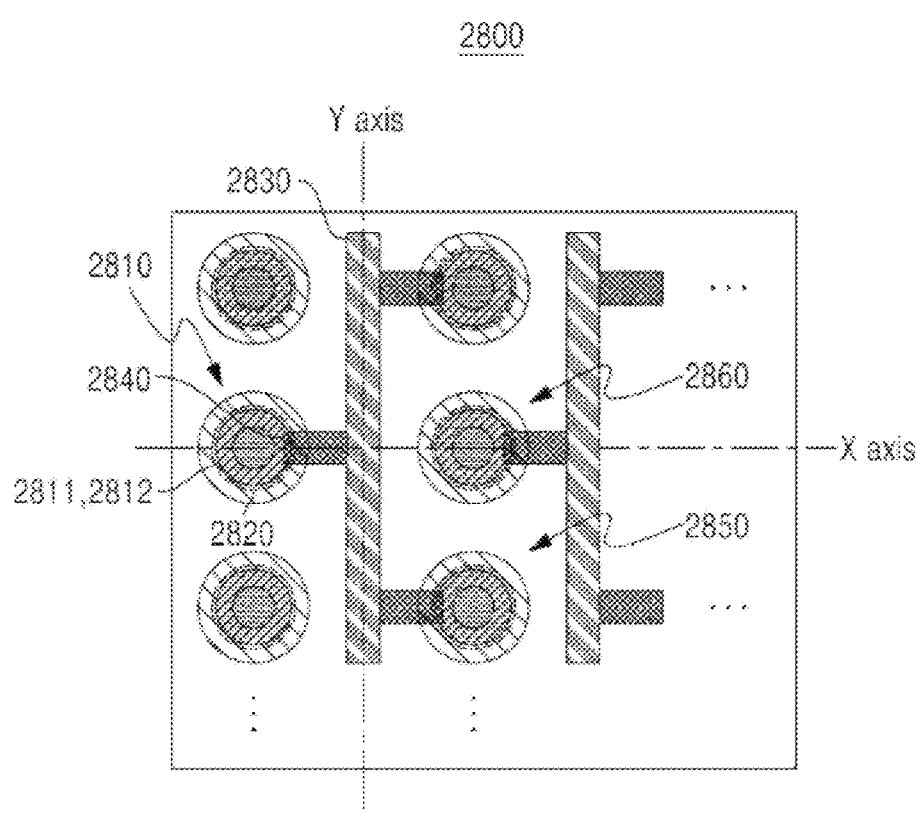
FIG. 28 is a top view illustrating a three-dimensional flash memory, according to an embodiment of the present disclosure.
Figure 29:
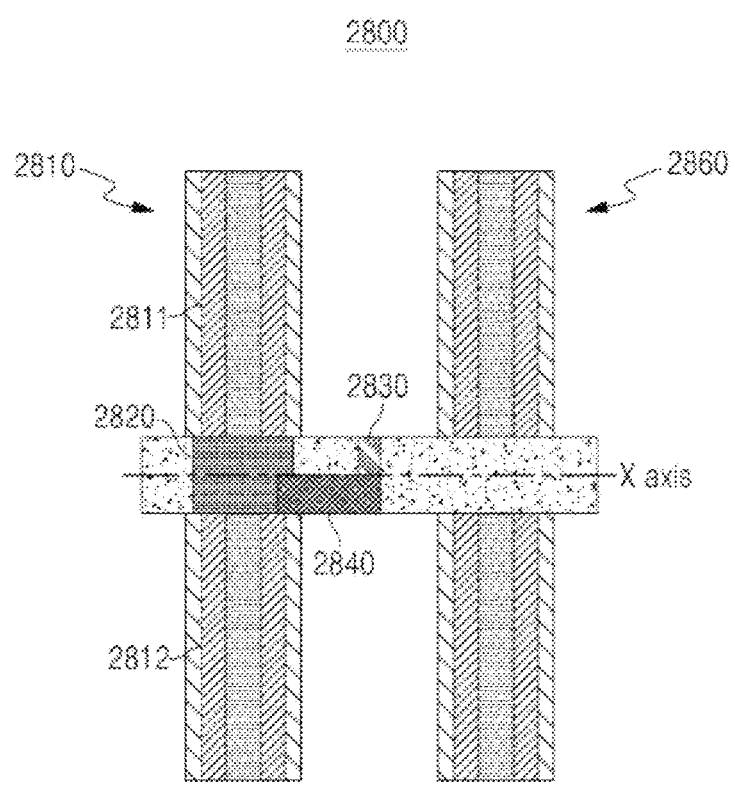
FIG. 29 is a cross-sectional view of the three-dimensional flash memory of FIG. 28, taken along an X-axis.
Figure 30:
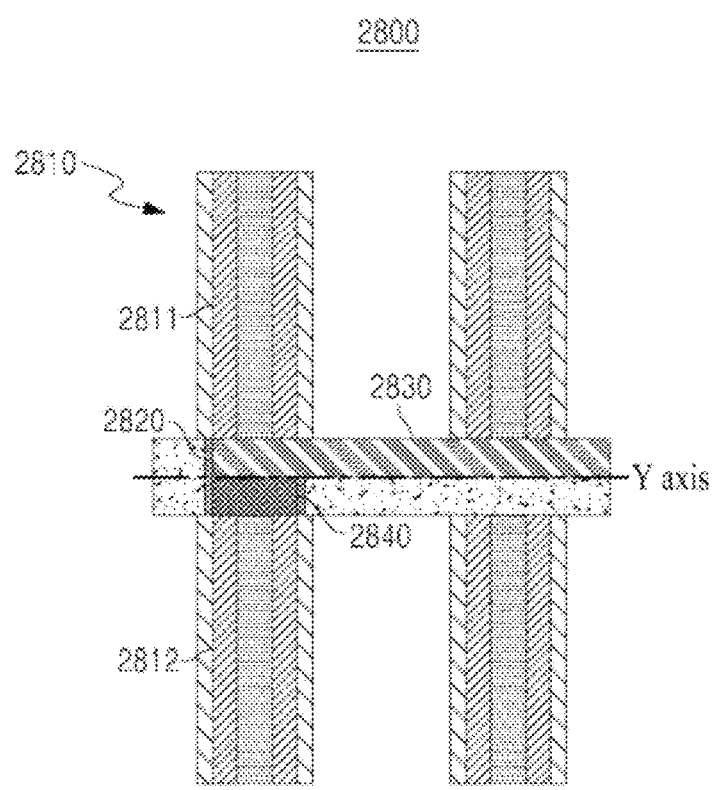
FIG. 30 is a cross-sectional view of the three-dimensional flash memory of FIG. 28, taken along a Y-axis.

FIG. 28 is a top view illustrating a three-dimensional flash memory, according to an embodiment of the present disclosure, FIG. 29 is a cross-sectional view of the three-dimensional flash memory device of FIG. 28, taken along an X-axis, and FIG. 30 is a cross-sectional view of the three-dimensional flash memory device of FIG. 28, taken along a Y-axis. More specifically, FIG. 28 is a top view illustrating a horizontal cross-section of a vertically intermediate region of a string in the three-dimensional flash memory.

Referring to FIGS. 28 to 30, a three-dimensional flash memory 2800 includes a string 2810 extending in one direction, a channel connector 2820, an intermediate wiring layer 2830, and a wiring connector 2840.

Although the string 2810 is described and illustrated as including channel layers 2811 and 2812 extending in one direction, the present disclosure is not limited thereto, and the string 2810 may include a plurality of electrode layers (not shown), which are stacked vertically with respect to the channel layers 2811 and 2812, and a plurality of insulating layers (not shown) respectively arranged between the plurality of electrode layers, in addition to the channel layers 2811 and 2812.

The channel connector 2820 connects an upper channel layer 2811 to a lower channel layer 2812 in an intermediate region of the string 2810. For example, like the channel layers 2811 and 2812, the channel connector 2820 may include an N− type material (for example, N-type polysilicon) through an implantation process of N− type ions. However, the present disclosure is not limited thereto, and the channel connector 2820 may include a metal material. This will be described in detail with reference to FIG. 31. As such, as the channel connector 2820 connects the upper channel layer 2811 to the lower channel layer 2812 in the intermediate region of the string 2810, both the upper channel layer 2811 and the lower channel layer 2812 are connected to a substrate including a P type bulk and an N+ contact, and thus, a bulk-based erase operation may be performed.

The intermediate wiring layer 2830 may include a metal material (for example, tungsten (W), titanium (Ti), tantalum (Ta), Copper (Cu), or gold (Au)) such that the intermediate wiring layer 2830 is capable of being selectively used as a source electrode or a drain electrode for the string 2810. More specifically, when an upper wiring layer (not shown) included in the three-dimensional flash memory 2800 is used as a source electrode, the intermediate wiring layer 2830, which is closest to the upper wiring layer while a memory cell to be controlled by both the intermediate wiring layer 2830 and the upper wiring layer is placed therebetween, may be used as a drain electrode, and when the upper wiring layer is used as a drain electrode, the intermediate wiring layer 2830, which is closest to the upper wiring layer while a memory cell to be controlled by both the intermediate wiring layer 2830 and the upper wiring layer is placed therebetween, may be used as a source electrode. Hereinafter, the memory cell refers to a charge storage layer, which is an information storage element in the three-dimensional flash memory device 2800, and an electrode layer directly contacting the charge storage layer.

Here, the intermediate wiring layer 2830 may be implemented as a plurality of intermediate wiring layers 2830. For example, when the intermediate wiring layer 2830 is implemented as the plurality of intermediate wiring layers 2830 including a first intermediate wiring layer, a second intermediate wiring layer, and a third intermediate wiring layer (where the first intermediate wiring layer, the second intermediate wiring layer, and the third intermediate wiring layer is vertically arranged in the stated order), the first intermediate wiring layer may be used as a drain electrode, and thus, the second intermediate wiring layer, which is closest to the first intermediate wiring layer while a memory cell to be controlled by both the first intermediate wiring layer and the second intermediate wiring layer is placed therebetween, may be used as a source electrode. In addition, the third intermediate wiring layer may be used as a source electrode, and thus, the second intermediate wiring layer, which is closest to the third intermediate wiring layer while a memory cell to be controlled by both the second intermediate wiring layer and the third intermediate wiring layer is placed therebetween, may be used as a drain electrode. That is, in response to using another wiring layer adjacent to the intermediate wiring layer 2830 as one of a source electrode and a drain electrode while a memory cell to be controlled by both the other wiring layer and the intermediate wiring layer 2830 is placed therebetween, the intermediate wiring layer 2830 may be adaptively used as the remaining one electrode other than the one electrode in use. Hereinafter, use of one wiring layer as a drain electrode or a source electrode according to circumstances means that the corresponding wiring layer is formed in a reconfigurable manner such that the corresponding wiring layer is capable of being adaptively used as one of a source electrode and a drain electrode. Thus, the intermediate wiring layer 2830 may be formed in a reconfigurable manner.

In particular, the intermediate wiring layer 2830 is located in a space between strings, thereby allowing the three-dimensional flash memory 2800 to be integrated and reduced in size. For example, the intermediate wiring layer 2830 may be located in a space between a first string 2810 and a second string 2850 and thus shared between the strings 2810 and 2850, the second string 2850 being a neighbor string adjacent to the first string 2810. Here, the strings 2810 and 2850 sharing the intermediate wiring layer 2830 may be the strings 2810 and 2850 diagonally adjacent to each other from among a plurality of strings included in the three-dimensional flash memory 2800.

Hereinafter, the statement that the intermediate wiring layer 2830 is shared between the strings 2810 and 2850 means that the intermediate wiring layer 2830 is selectively used as one of a source electrode and a drain electrode for the first string 2810 simultaneously with being selectively used as one of a source electrode and a drain electrode for the second string 2850. To this end, the intermediate wiring layer 2830 may be connected to the channel connector 2820 of the first string 2810 and simultaneously connected to a channel connector (not shown) of the second string 2850.

The wiring connector 2840 connects the channel connector 2820 to the intermediate wiring layer 2830 while being at least partially buried in the string 2810. For example, the wiring connector 2840 may be formed of an N+ type material (for example, N+ type polysilicon) to be at least partially buried in the string 2810, by an implantation process of N+ type ions.

Heretofore, although the structure of the three-dimensional flash memory 2800 has been described based on one string 2810, the present disclosure is not limited thereto, and the three-dimensional flash memory 2800 according to an embodiment of the present disclosure may have a structure that is based on a plurality of strings 2810 and 2850 sharing the intermediate wiring layer 2830. In this case, the three-dimensional flash memory 2800 may be described as having a structure including: the diagonally adjacent strings 2810 and 2850 from among the plurality of strings; the channel connector 2820 connecting the upper channel layer 2811 to the lower channel layer 2812 of each of the diagonally adjacent strings 2810 and 2850; the intermediate wiring layer 2830, which is shared by the diagonally adjacent strings 2810 and 2850 and is capable of being selectively used as one of a source electrode and a drain electrode for each of the diagonally adjacent strings 2810 and 2850; and the wiring connector 2840 connecting, to each other, the channel connector 2820 and the intermediate wiring layer 2830 of each of the diagonally adjacent strings 2810 and 2850 while being at least partially buried in each of the diagonally adjacent strings 2810 and 2850. When strings sharing the intermediate wiring layer 2830 are not the diagonally adjacent strings 2810 and 2850 but horizontally adjacent strings, the three-dimensional flash memory 2800 may have a structure that is based on the horizontally adjacent strings. This will be described in detail with reference to FIGS. 54 to 57.

As such, the three-dimensional flash memory 2800 includes the intermediate wiring layer 2830, which is capable of being selectively used as one of a source electrode and a drain electrode, between the adjacent strings 2810 and 2850 and simultaneously includes the channel connector 2820, which connects the upper channel layer 2811 to the lower channel layer 2812, in the strings 2810 and 2850, whereby a cell current decreasing with increasing lengths of the channel layers 2811 and 2812 may increase, the deterioration in cell characteristics due to a reduction in cell current may be improved, a bulk erase operation based on a bulk of a substrate may be supported, and an improvement in a degree of integration and simplification of a wiring process may be achieved.

Figure 31:
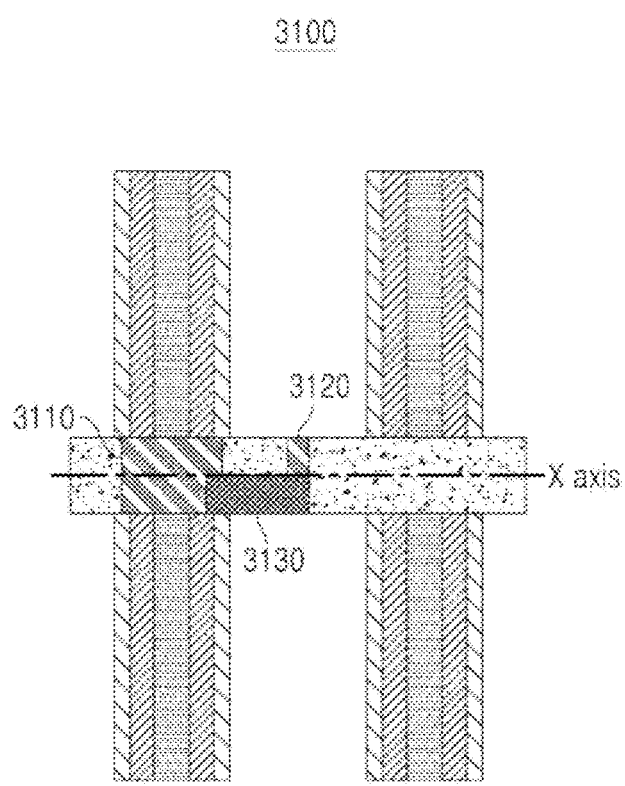
FIG. 31 is a cross-sectional view of the three-dimensional flash memory of FIG. 28, according to another embodiment of the present disclosure.

FIG. 31 is a cross-sectional view of the three-dimensional flash memory of FIG. 28, according to another embodiment of the present disclosure.

Referring to FIG. 31, although a three-dimensional flash memory 3100 according to another embodiment of the present disclosure has the same structure as the three-dimensional flash memory 2800 described with reference to FIGS. 28 to 30, there is a difference in that a channel connector 3110 includes a metal material. More specifically, the channel connector 3110 included in the three-dimensional flash memory 3100 according to another embodiment of the present disclosure may include the same metal material (for example, at least one of tungsten (W), titanium (Ti), tantalum (Ta), Copper (Cu), or gold (Au)) as an intermediate wiring layer 3120.

While the three-dimensional flash memory 3100, which has been manufactured as described above, according to another embodiment of the present disclosure has a difference in material constituting the channel connector 3110 from the three-dimensional flash memory 2800 according to an embodiment of the present disclosure, the three-dimensional flash memory 3100 may have a difference in number of mask-based etching processes from the three-dimensional flash memory 2800, in terms of a manufacturing process. For example, because the intermediate wiring layer 2830 and the channel connector 2820 include different materials from each other, the three-dimensional flash memory 2800, which is described with reference to FIG. 28, according to an embodiment of the present disclosure is manufactured through a total of three mask-based etching processes including a first mask process for forming the wiring connector 2840, a second mask process for forming the intermediate wiring layer 2830, and a third mask process for forming the channel connector 2820, whereas, because the intermediate wiring layer 3120 and the channel connector 3110 include the same material, the three-dimensional flash memory 3100 according to another embodiment of the present disclosure may be manufactured through a total of two mask-based etching processes including a first mask process for forming a wiring connector 3130 and a second process for simultaneously forming the intermediate wiring layer 3120 and the channel connector 3110. However, the present disclosure is not limited thereto, and the three-dimensional flash memory 2800 according to an embodiment of the present disclosure and the three-dimensional flash memory 3100 according to another embodiment of the present disclosure may be manufactured through various processes allowing the above-described structures to be implemented. A manufacturing method will be described in detail with reference to FIGS. 33 to 36.

In addition, the three-dimensional flash memory 2800 according to an embodiment of the present disclosure and the three-dimensional flash memory 3100 according to another embodiment of the present disclosure may be implemented in a structure including an additional connector (not shown), which respectively connects the intermediate wiring layers 2830 and 3120 to the wiring connectors 2840 and 3130, in addition to the above-described structures. This will be described in detail with reference to FIG. 32.

Figure 32:
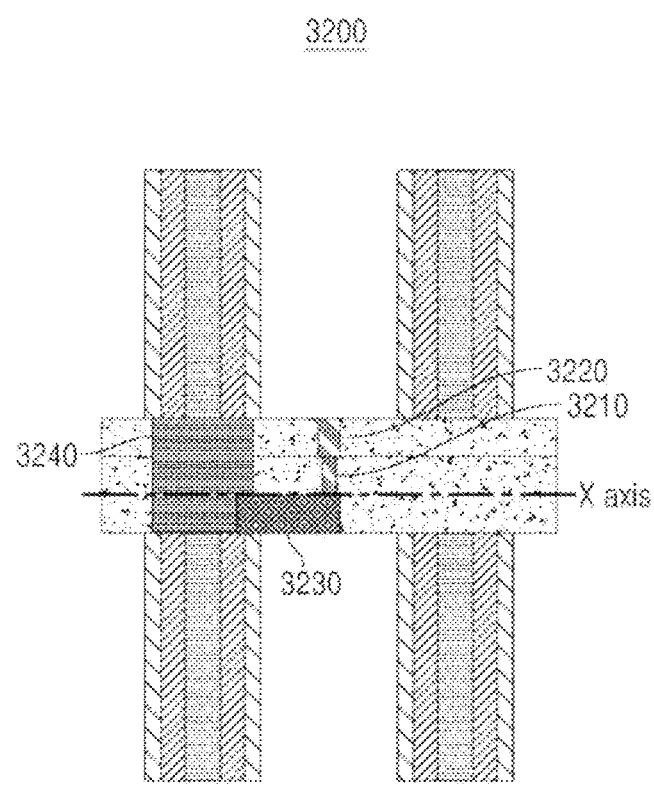
FIG. 32 is a cross-sectional view of the three-dimensional flash memory of FIG. 28, according to yet another embodiment of the present disclosure.

FIG. 32 is a cross-sectional view of the three-dimensional flash memory of FIG. 28, according to yet another embodiment of the present disclosure.

Referring to FIG. 32, although a three-dimensional flash memory device 3200 according to yet another embodiment of the present disclosure has the same structure as the three-dimensional flash memory 2800 described with reference to FIGS. 28 to 30, there is a difference in that the three-dimensional flash memory device 3200 further includes an additional connector 3210. Specifically, the additional connector 3210, which is an additional component for connecting an intermediate wiring layer 3220 to a wiring connector 3230, may be a component not extending in the Y-axis direction shown in FIG. 28 like the wiring connector 3230, unlike the intermediate wiring layer 3220 extending in the Y-direction. Thus, a structure including the additional connector 3210 may be used when it is difficult to apply a structure in which the intermediate wiring layer 3220 directly contacts the wiring connector 3230.

Although FIG. 32 illustrates that the three-dimensional flash memory device 3200 according to yet another embodiment of the present disclosure includes a channel connector 3240 including an N− type material, the present disclosure is not limited thereto, and the structure including the additional connector 3210 may be applied even when the channel connector 3240 includes a metal material.

While the three-dimensional flash memory 3200, which has been manufactured as described above, according to yet another embodiment of the present disclosure has only a difference of further including the additional connector 3210 unlike the three-dimensional flash memory 2800 according to an embodiment of the present disclosure and the three-dimensional flash memory 3100 according to another embodiment of the present disclosure, the three-dimensional flash memory 3200 may have a difference in number of mask-based etching processes, in terms of a manufacturing process. For example, as described above with reference to FIG. 31, while the three-dimensional flash memory 2800 according to an embodiment of the present disclosure is manufactured through a total of three mask-based etching processes and the three-dimensional flash memory 3100 according to another embodiment of the present disclosure is manufactured through a total of two mask-based etching processes, the three-dimensional flash memory 3200 according to yet another embodiment of the present disclosure may be manufactured through a total of four mask-based etching processes including a first mask process for forming the wiring connector 3230, a second mask process for forming the additional connector 3210, a third mask process for forming the intermediate wiring layer 3220, and a fourth mask process for forming the channel connector 3240.

Figure 33:
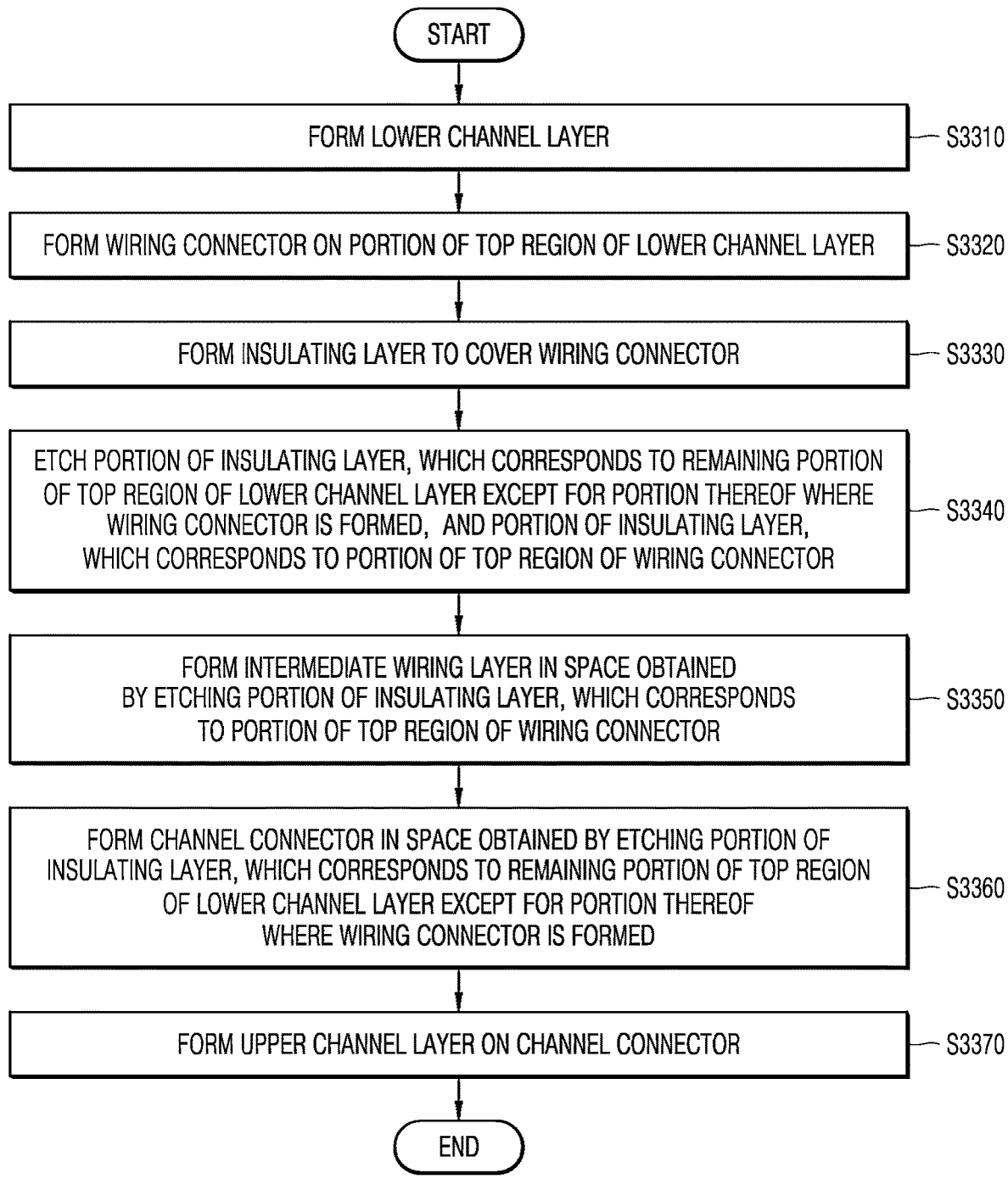
FIG. 33 is a flowchart illustrating a method of manufacturing a three-dimensional flash memory, according to an embodiment of the present disclosure.

FIG. 33 is a flowchart illustrating a method of manufacturing a three-dimensional flash memory, according to an embodiment of the present disclosure, FIGS. 34 to 39 are cross-sectional views illustrating the method of manufacturing the three-dimensional flash memory, according to an embodiment of the present disclosure, FIGS. 40 to 45 are diagrams illustrating the method of manufacturing the three-dimensional flash memory, according to another embodiment of the present disclosure, and FIGS. 46 to 53 are diagrams illustrating the method of manufacturing the three-dimensional flash memory, according to yet another embodiment of the present disclosure.

Hereinafter, it is premised that the method of manufacturing the three-dimensional flash memory, which will be described with reference to FIGS. 33 to 53, is performed by a manufacturing system automated and mechanized, and the method of manufacturing the three-dimensional flash memory refers to a method of manufacturing the three-dimensional flash memory 2800 described with reference to FIGS. 28 to 30, the three-dimensional flash memory 3100 described with reference to FIG. 31, and the three-dimensional flash memory 3200 described with reference to FIG. 32.

In addition, cross-sectional views of FIGS. 34 to 53 refer to cross-sectional views of the strings 2810 and 2860 of FIG. 28, taken in the X-axis direction, for describing the method of manufacturing the three-dimensional flash memory.

Although it is described that the three-dimensional flash memory based on the string 2810 shown in FIG. 28 is manufactured through the manufacturing method described below, the three-dimensional flash memory based on the string 2850 may also be identically manufactured by the manufacturing method described below.

Figure 34:
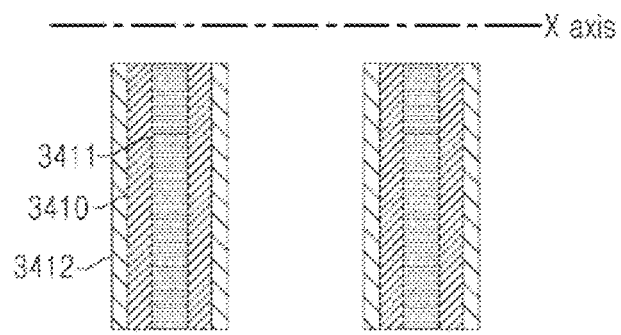
FIGS. 34 to 39 are cross-sectional views illustrating a method of manufacturing a three-dimensional flash memory, according to an embodiment of the present disclosure.
Figure 40:
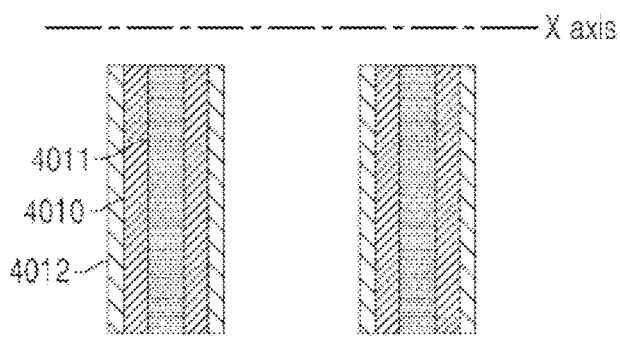
FIGS. 40 to 45 are diagrams illustrating a method of manufacturing a three-dimensional flash memory, according to another embodiment of the present disclosure.
Figure 46:
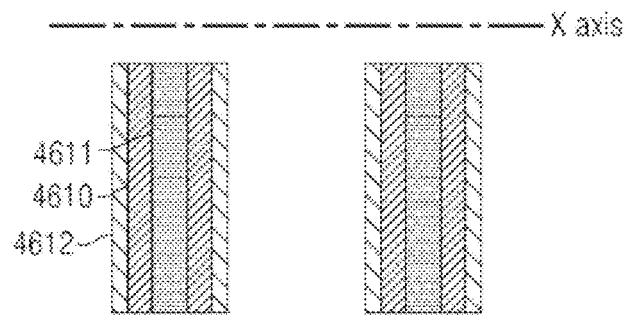
FIGS. 46 to 53 are diagrams illustrating a method of manufacturing a three-dimensional flash memory, according to yet another embodiment of the present disclosure.

First, in operation S3310, by the manufacturing system, lower channel layers 3410, 4010, and 4610 are formed. For example, by the manufacturing system, the lower channel layers 3410, 4010, and 4610 may be formed of an N− type material, as shown in FIGS. 34, 40, and 46. Here, the lower channel layers 3410, 4010, and 4610 may each have a tubular shape having an empty inside, and in this case, filling films 3411, 4011, and 4611 respectively filling insides of the lower channel layers 3410, 4010, and 4610, and sidewalls 3412, 4012, and 4612 respectively surrounding outsides of the lower channel layers 3410, 4010, and 4610 may be further arranged.

Figure 35:
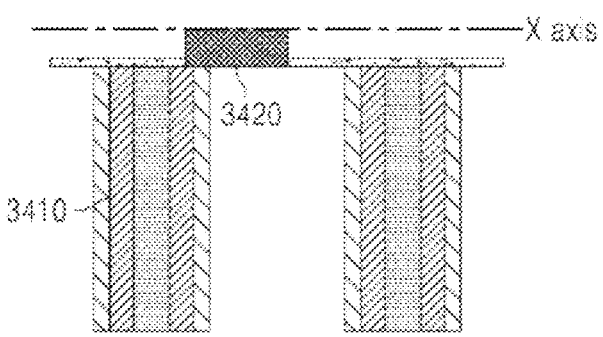
Figure 41:
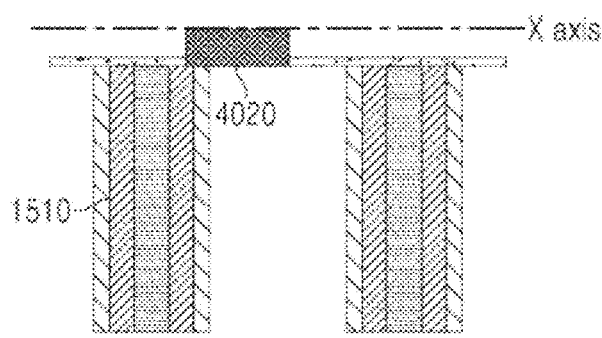
Figure 47:
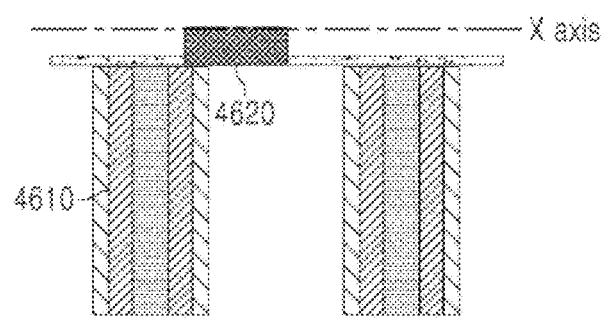

Next, in operation S3320, by the manufacturing system, wiring connectors 3420, 4020, and 4620 are respectively formed on portions of top regions of the lower channel layers 3410, 4010, and 4610. For example, as shown in FIGS. 35, 41, and 47, by the manufacturing system, the wiring connectors 3420, 4020, and 4620 may be respectively formed of N+ type materials from the portions of the top regions of the lower channel layers 3410, 4010, and 4610 to spaces between strings by an implantation process of N+ type ions. As a more particular example, by the manufacturing system, the wiring connectors 3420, 4020, and 4620 may be respectively formed to partially overlap the portions of the top regions of the lower channel layers 3410, 4010, and 4610 by using a mask process.

Figure 36:
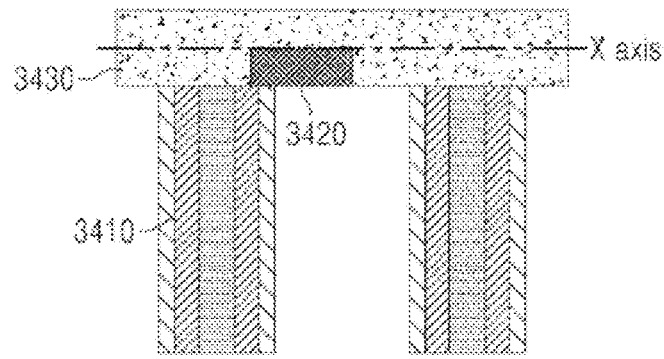
Figure 42:
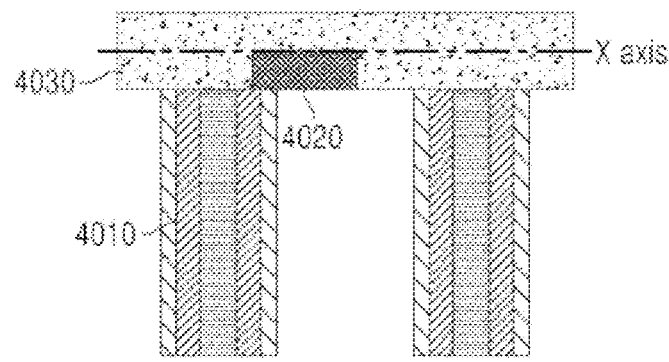
Figure 48:
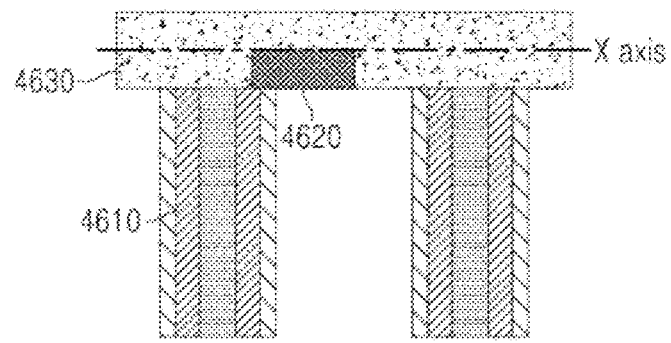

Next, in operation S3330, by the manufacturing system, insulating layers 3430, 4030, and 4630 are respectively formed to cover the wiring connectors 3420, 4020, and 4620. For example, by the manufacturing system, the insulating layers 3430, 4030, and 4630 may be respectively formed of insulating materials, as shown in FIGS. 36, 42, and 48. Here, the insulating layers 3430, 4030, and 4630 may include the same material as an interlayer dielectric (not shown) arranged between a plurality of electrode layers (not shown) included in a string.

Next, in operation S3340, by the manufacturing system, portions of the insulating layers 3430, 4030, and 4630, which respectively correspond to remaining portions of the top regions of the lower channel layers 3410, 4010, and 4610 except for the portions thereof where the wiring connectors 3420, 4020, and 4620 are formed, and portions of the insulating layers 3430, 4030, and 4630, which respectively correspond to portions of top regions of the wiring connectors 3420, 4020, and 4620, are etched.

Next, in operation S3350, by the manufacturing system, intermediate wiring layers 3440, 4040, and 4640 are respectively formed in spaces obtained by etching the portions of the insulating layers 3430, 4030, and 4630, which correspond to the portions of the top regions of the wiring connectors 3420, 4020, and 4620.

Next, in operation S3360, by the manufacturing system, channel connectors 3450, 4050, and 4650 are respectively formed in spaces 3432, 4032, and 4632 obtained by etching the portions of the insulating layers 3430, 4030, and 4630, which correspond to the remaining portions of the top regions of the lower channel layers 3410, 4010, and 4610 except for the portions thereof where the wiring connectors 3420, 4020, and 4620 are formed.

Here, operations S3340 to S3360 may be differently performed in terms of details thereof according to which one of the three-dimensional flash memory 2800 described with reference to FIG. 28, the three-dimensional flash memory 3100 described with reference to FIG. 31, and the three-dimensional flash memory 3200 described with reference to FIG. 32 is intended to be manufactured.

Figure 37:
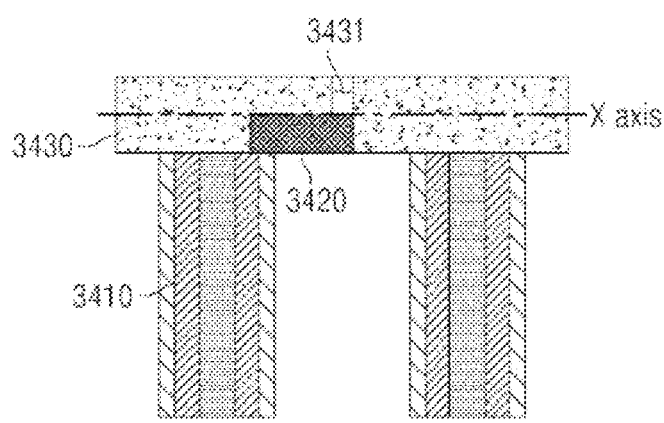
Figure 37:
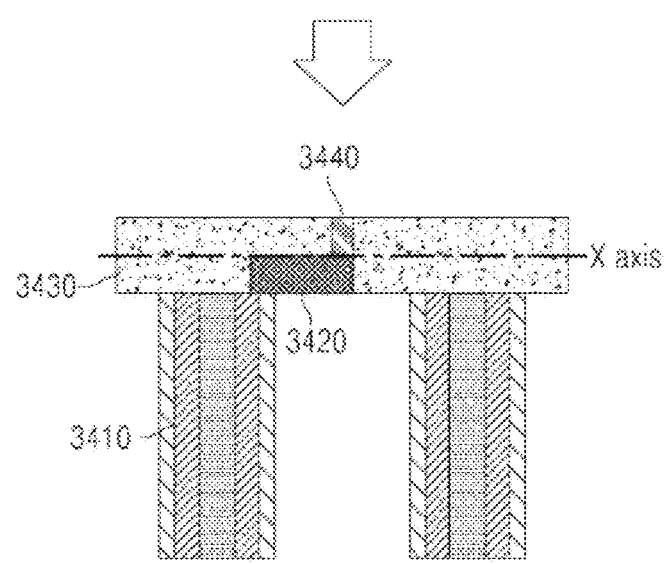
Figure 38:
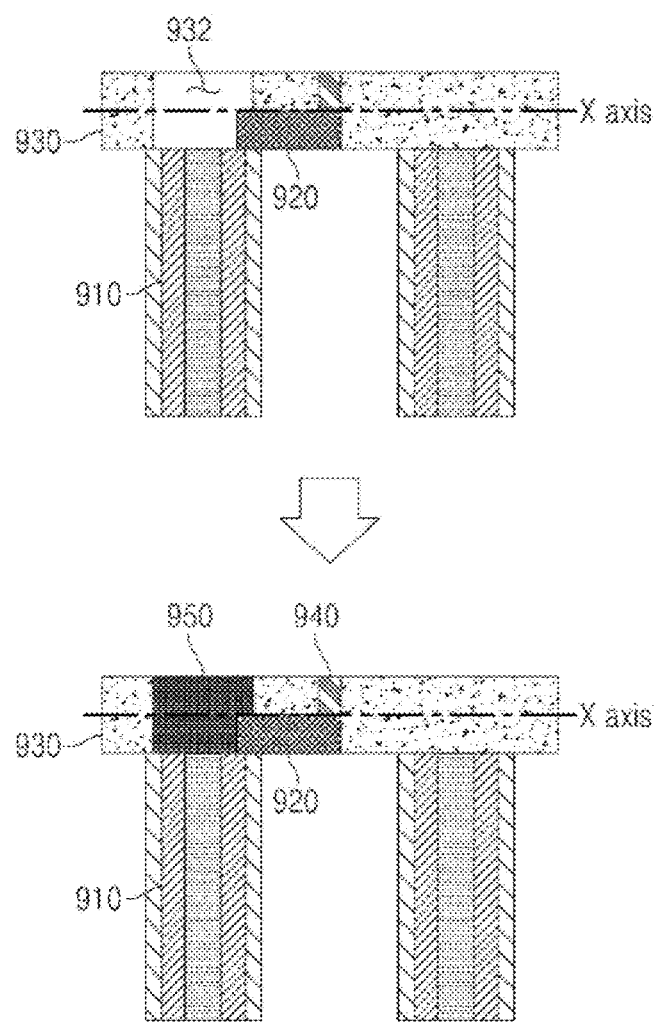

For example, when the three-dimensional flash memory 2800 described with reference to FIG. 28 is intended to be manufactured, after the portion of the insulating layer 3430, which corresponds to the portion of the top region of the wiring connector 3420, is etched by a mask process by the manufacturing system, as shown in FIG. 37, the intermediate wiring layer 3440 may be formed, by the manufacturing system, in the space obtained by etching the portion of the insulating layer 3430, which corresponds to the portion of the top region of the wiring connector 3420. Next, by the manufacturing system, after the portion of the insulating layer 3430, which corresponds to the remaining portion of the top region of the lower channel layer 3410 except for the portion thereof where the wiring connector 3420 is formed, is etched by a mask process, as shown in FIG. 38, the channel connector 3450 may be formed in the space 3432 obtained by etching the portion of the insulating layer 3430, which corresponds to the remaining portion of the top region of the lower channel layer 3410 except for the portion thereof where the wiring connector 3420 is formed. Here, by the manufacturing system, the intermediate wiring layer 3440 and the channel connector 3450 may be formed such that the wiring connector 3420 at least partially buried in the string contacts both the intermediate wiring layer 3440 and the channel connector 3450.

Figure 43:
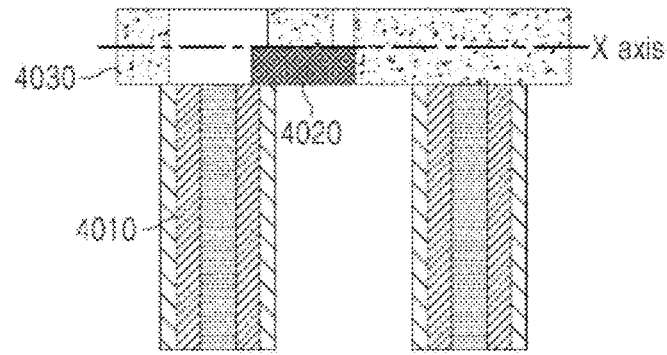
Figure 44:
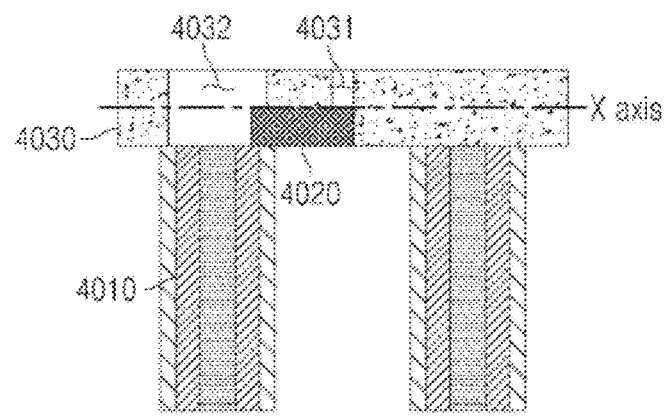
Figure 44:
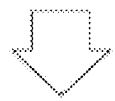
Figure 44:
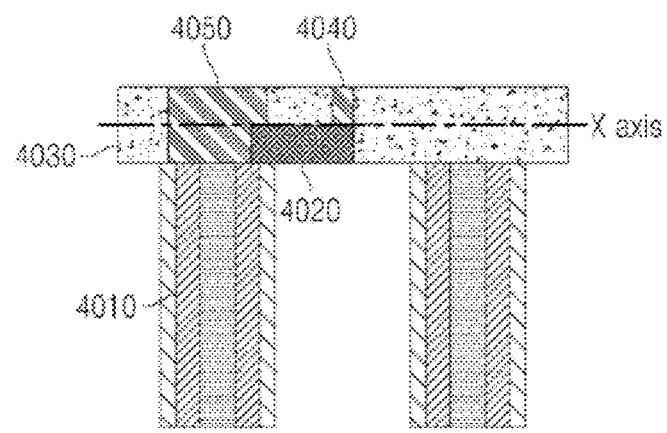

As another example, when the three-dimensional flash memory 3100 described with reference to FIG. 31 is intended to be manufactured, after the portion of the insulating layer 4030, which corresponds to the portion of the top region of the wiring connector 4020, and the portion of the insulating layer 4030, which corresponds to the remaining portion of the top region of the lower channel layer 4010 except for the portion thereof where the wiring connector 4020 is formed, are etched by a mask process by the manufacturing system, as shown in FIG. 43, the intermediate wiring layer 4040 may be formed, by the manufacturing system, in the space 4031 obtained by etching the portion of the insulating layer 4030, which corresponds to the portion of the top region of the wiring connector 4020, as shown in FIG. 44, and the channel connector 4050 may be formed, by the manufacturing system, in the space 4032 obtained by etching the portion of the insulating layer 4030, which corresponds to the remaining portion of the top region of the lower channel layer 4010 except for the portion thereof where the wiring connector 4020 is formed. Here, by the manufacturing system, the intermediate wiring layer 4040 and the channel connector 4050 may be formed such that the wiring connector 4020 at least partially buried in the string contacts both the intermediate wiring layer 4040 and the channel connector 4050.

Figure 49:
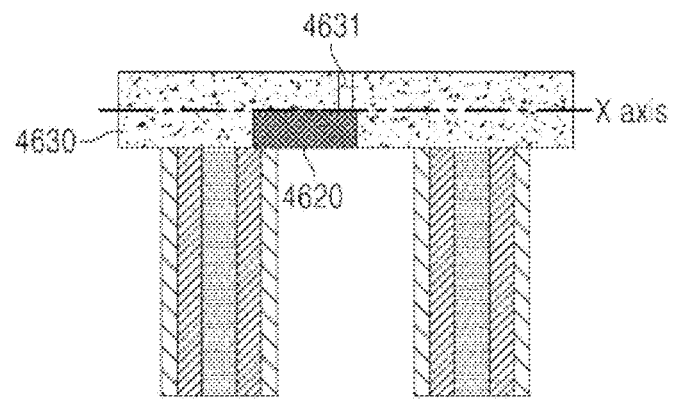
Figure 49:
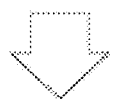
Figure 49:
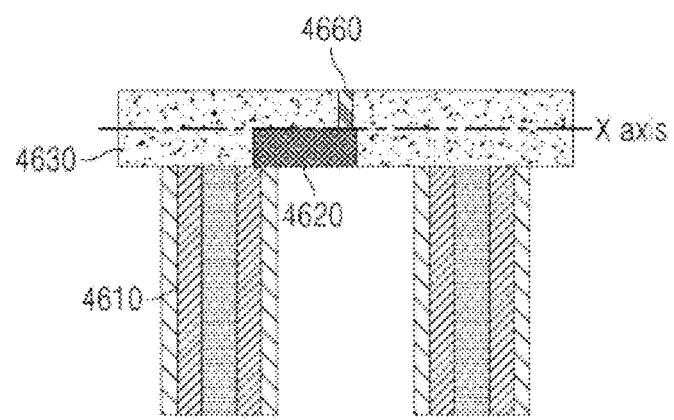
Figure 50:
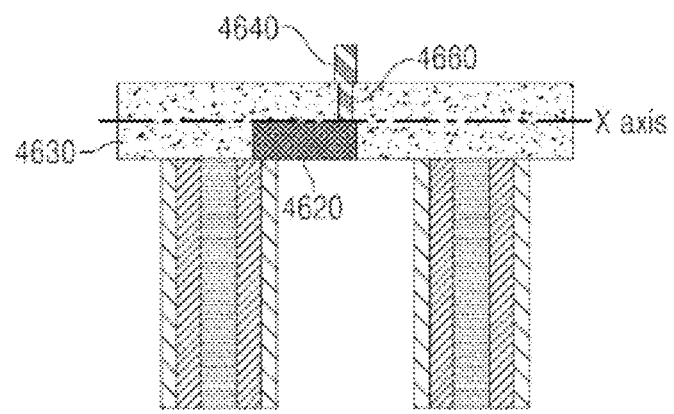
Figure 51:
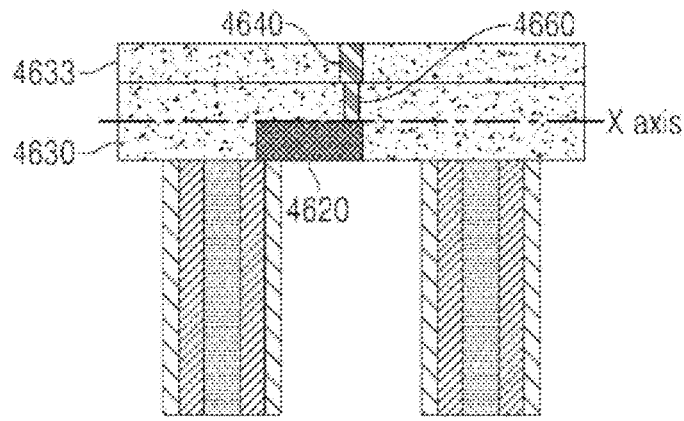
Figure 52:
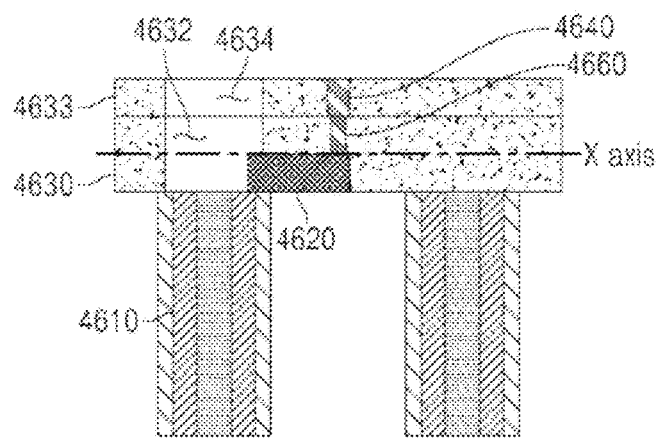
Figure 52:
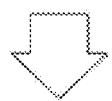
Figure 52:
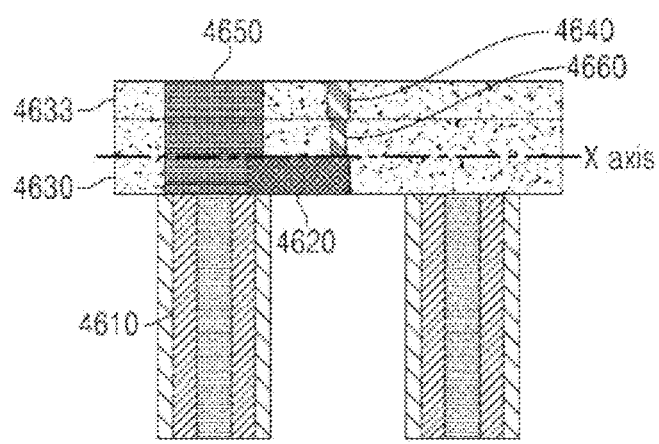

As yet another example, when the three-dimensional flash memory 3200 described with reference to FIG. 32 is intended to be manufactured, after the portion of the insulating layer 4630, which corresponds to the portion of the top region of the wiring connector 4620, is etched by a mask process by the manufacturing system, as shown in FIG. 49, an additional connector 4660 may be formed, by the manufacturing system, in the space 4631 obtained by etching the portion of the insulating layer 4630, which corresponds to the portion of the top region of the wiring connector 4620. Next, by the manufacturing system, after the intermediate wiring layer 4640 is formed on the additional connector 4660 by a mask process as shown in FIG. 50, an additional insulating layer 4633 is formed to cover the intermediate wiring layer 4640 as shown in FIG. 51. Thus, as shown in FIG. 52, by the manufacturing system, after portions of the insulating layer 4630 and the additional insulating layer 4633, which respectively correspond to the remaining portions of the top regions of the lower channel layer 4610 except for the portions thereof where the wiring connector 4620 is formed, are etched by a mask process, the channel connector 4650 may be formed in the spaces 4632 and 4634 obtained by etching the portions of the insulating layer 4630 and the additional insulating layer 4633, which respectively correspond to the remaining portions of the top regions of the lower channel layer 4610 except for the portions thereof where the wiring connector 4620 is formed. Here, by the manufacturing system, the additional connector 4660 and the channel connector 4650 may be formed such that the wiring connector 4620 at least partially buried in the string contacts both the additional connector 4660 and the channel connector 4650, the additional connector 4660 contacting the intermediate wiring layer 4640.

Figure 39:
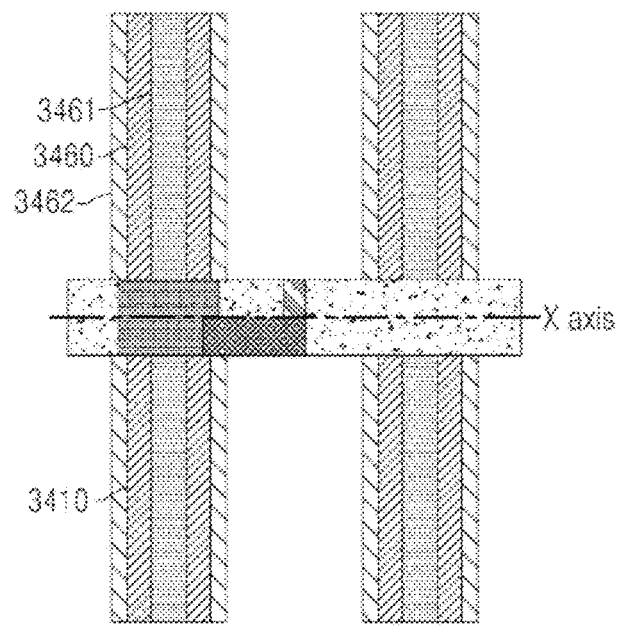
Figure 45:
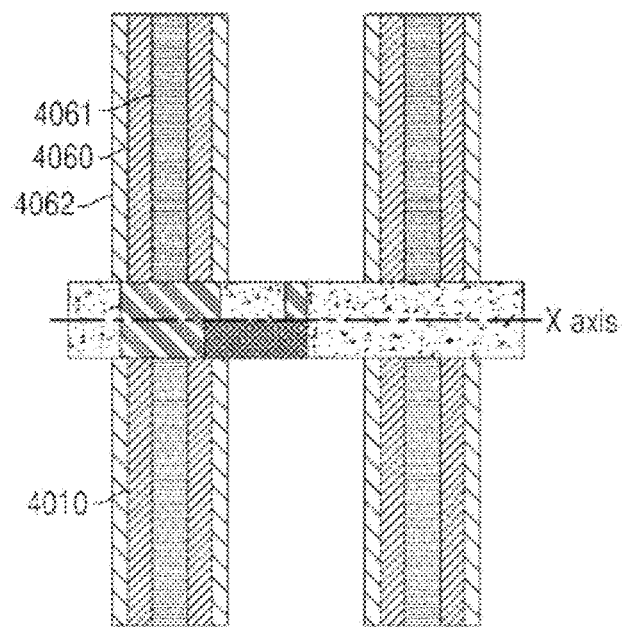
Figure 53:
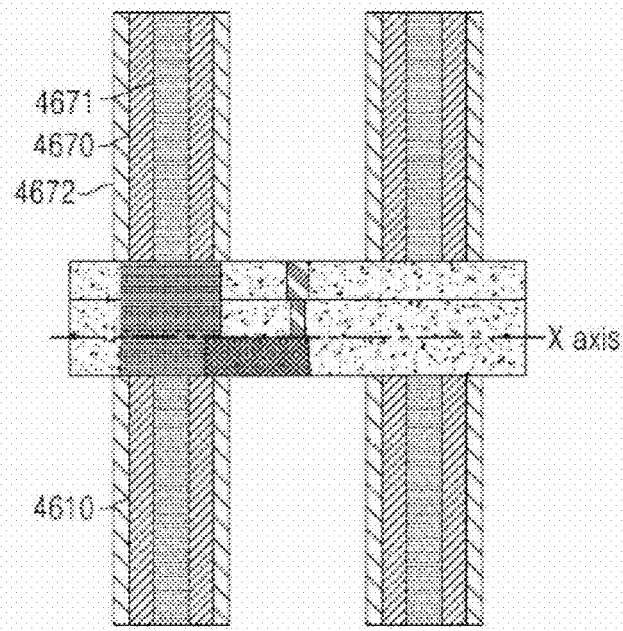

Next, in operation S3370, by the manufacturing system, upper channel layers 3460, 4060, and 4670 are respectively formed on the channel connectors 3450, 4050, and 4650. For example, by the manufacturing system, the upper channel layers 3460, 4060, and 4670 may be respectively formed of N− type materials, as shown in FIGS. 39, 45, and 53. Here, like the lower channel layers 3410, 4010, and 4610, the upper channel layers 3460, 4060, and 4670 may each have a tubular shape having an empty inside, and in this case, filling films 3461, 4061, and 4671 respectively filling the insides of the upper channel layers 3460, 4060, and 4670, and sidewalls 3462, 4062, and 4672 respectively surrounding outsides of the upper channel layers 3460, 4060, and 4670 may be further arranged.

Figure 54:
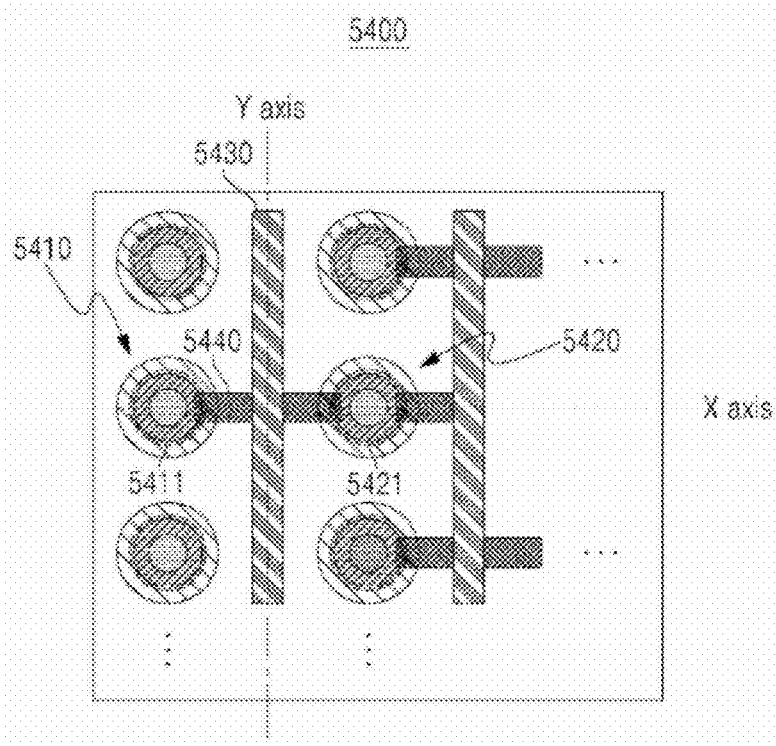
FIG. 54 is a top view illustrating a three-dimensional flash memory, according to another embodiment of the present disclosure.
Figure 55:
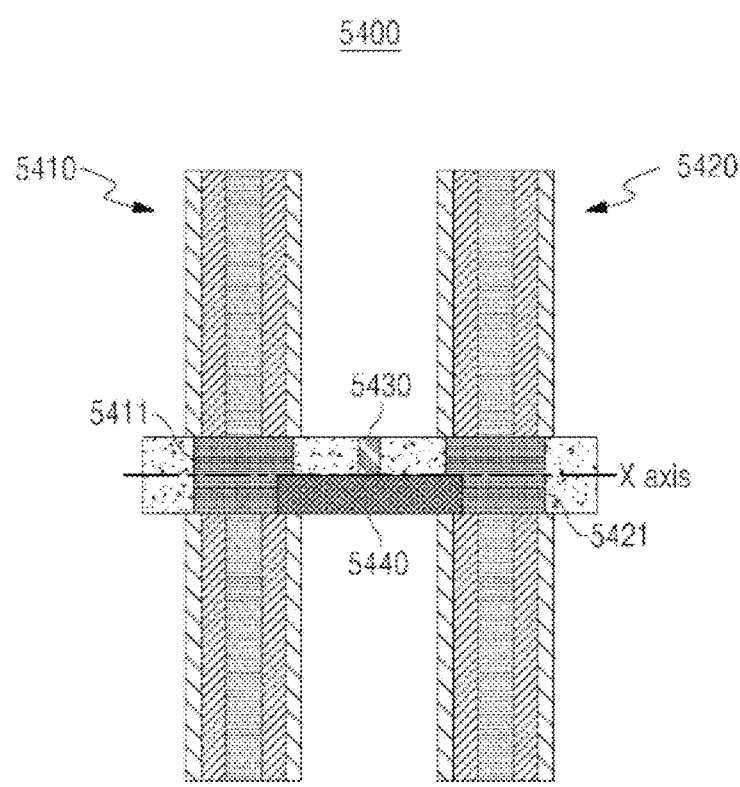
FIG. 55 is a cross-sectional view of the three-dimensional flash memory of FIG. 54, taken along an X-axis.

FIG. 54 is a top view illustrating a three-dimensional flash memory, according to another embodiment of the present disclosure, and FIG. 55 is a cross-sectional view of the three-dimensional flash memory of FIG. 54, taken along an X-axis.

Referring to FIGS. 54 and 55, while a three-dimensional flash memory 5400 according to another embodiment of the present disclosure has a similar structure to the three-dimensional flash memory 2800 described with reference to FIGS. 28 to 30, there is a difference in that an intermediate wiring layer 5430 arranged between strings 5410 and 5420 is shared by the strings 5410 and 5420 horizontally adjacent to each other rather than by diagonally adjacent strings.

More specifically, for the intermediate wiring layer 5430 to be shared by the strings 5410 and 5420 horizontally adjacent to each other, a wiring connector 5440 may be formed to be at least partially buried in each of the strings 5410 and 5420, thereby connecting channel connectors 5411 and 5421 of the respective strings 5410 and 5420 to the intermediate wiring layer 5430.

Because materials respectively constituting the wiring connector 5440, the channel connectors 5411 and 5421, and the intermediate wiring layer 5430 are the same as those of the wiring connector 2840, the channel connector 2820, and the intermediate wiring layer 2830 included in the three-dimensional flash memory 2800 described with reference to FIGS. 28 to 30, descriptions thereof will be omitted.

Figure 56:
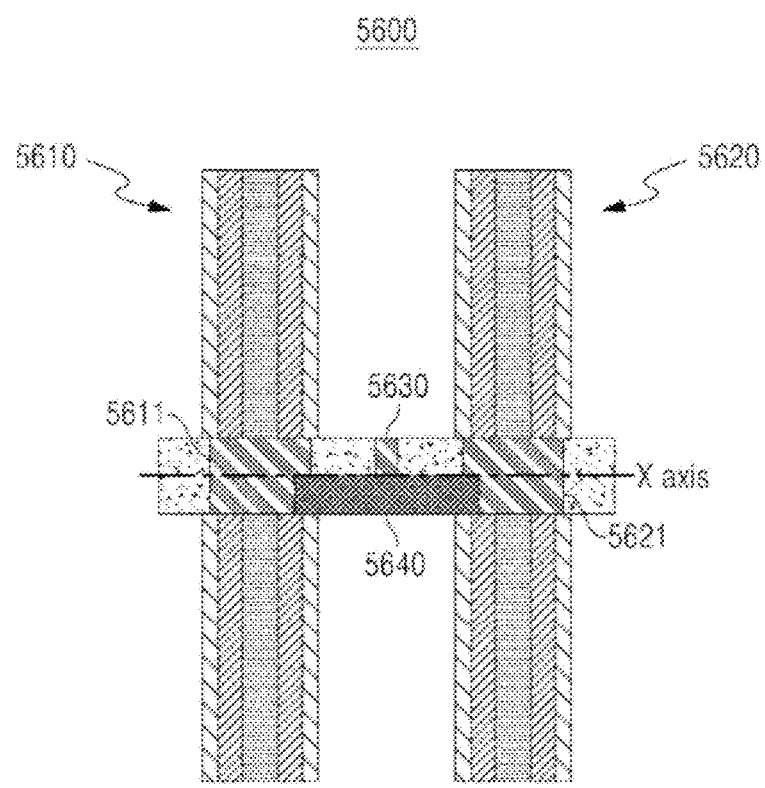
FIG. 56 is a cross-sectional view of the three-dimensional flash memory of FIG. 54, according to another embodiment of the present disclosure.

FIG. 56 is a cross-sectional view of the three-dimensional flash memory of FIG. 54, according to another embodiment of the present disclosure.

Referring to FIG. 56, while channel connectors 5611 and 5621 in a three-dimensional flash memory 5600 includes a metal material (for example, at least one of tungsten (W), titanium (Ti), tantalum (Ta), Copper (Cu), or gold (Au)) like the channel connector 3110 included in the three-dimensional flash memory 3100 described with reference to FIG. 31, there is a difference in that an intermediate wiring layer 5630 is shared by horizontally adjacent strings 5610 and 5620 rather than by diagonally adjacent strings, as described with reference to FIGS. 54 and 55. Likewise, for the intermediate wiring layer 5630 to be shared by the horizontally adjacent strings 5610 and 5620, a wiring connector 5640 may be formed to be at least partially buried in each of the strings 5610 and 5620, thereby connecting the channel connectors 5611 and 5621 of the respective strings 5610 and 5620 to the intermediate wiring layer 5630.

Because materials respectively constituting the wiring connector 5640, the channel connectors 5611 and 5621, and the intermediate wiring layer 5630 are the same as those of the wiring connector 3130, the channel connector 3110, and the intermediate wiring layer 3120 included in the three-dimensional flash memory 3100 described with reference to FIG. 31, descriptions thereof will be omitted.

Figure 57:
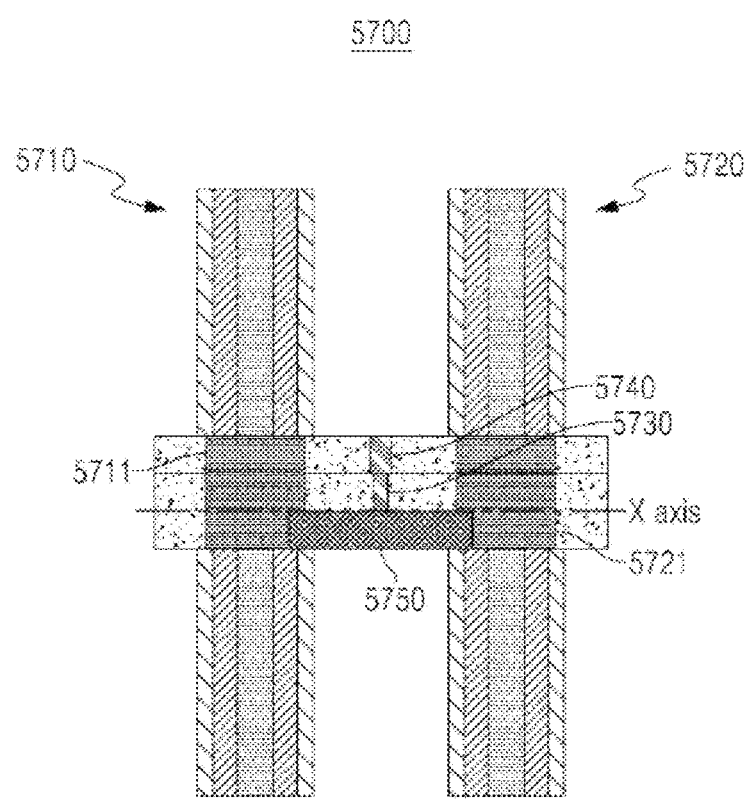
FIG. 57 is a cross-sectional view of the three-dimensional flash memory of FIG. 54, according to yet another embodiment of the present disclosure.

FIG. 57 is a cross-sectional view of the three-dimensional flash memory of FIG. 54, according to yet another embodiment of the present disclosure.

Referring to FIG. 57, while a three-dimensional flash memory 5700 has a structure of further including an additional connector 5730 like the three-dimensional flash memory 3200 described with reference to FIG. 32, an intermediate wiring layer 5740 is shared by horizontally adjacent strings 5710 and 5720 rather than by diagonally adjacent strings, as described with reference to FIGS. 54 and 55. Likewise, for the intermediate wiring layer 5740 to be shared by the horizontally adjacent strings 5710 and 5720, a wiring connector 5750 may be formed to be at least partially buried in each of the strings 5710 and 5720, thereby connecting channel connectors 5711 and 5721 of the respective strings 5710 and 5720 to the additional connector 5730.

Because materials respectively constituting the wiring connector 5750, the channel connectors 5711 and 5721, the intermediate wiring layer 5740, and the additional connector 5730 are the same as those of the wiring connector 3230, the channel connector 3240, the intermediate wiring layer 3220, and the additional connector 3210 included in the three-dimensional flash memory 3200 described with reference to FIG. 32, descriptions thereof will be omitted.

Although the method of manufacturing the three-dimensional flash memories 5400, 5600, and 5700, described with reference to FIGS. 54 to 57, is the same as the method of manufacturing the three-dimensional flash memory, described with reference to FIGS. 33 to 53, there is a difference in that the intermediate wiring layer shared by the horizontally adjacent strings rather than by the diagonally adjacent strings is fabricated. Thus, descriptions of the manufacturing method thereof will be omitted.

Heretofore, although the present disclosure has been described with reference to particular embodiments in conjunction with the accompanying drawings, it will be understood that various modifications and changes may be made by those of ordinary skill in the art without departing from the spirit and scope of the present disclosure. For example, even when the described operations are performed in a different order from the described order and/or the described components such as systems, structures, devices, and circuits are coupled to or combined with each other in different manners from the described manner or replaced or substituted by other components or equivalents thereof, proper results may be achieved.

Therefore, it should be understood that other implementations, other embodiments, and equivalents of the appended claims also fall within the scope of the appended claims.

The invention claimed is:

1. A three-dimensional flash memory device comprising:
a string that includes a channel layer extending in one direction and a plurality of electrode layers stacked vertically with respect to the channel layer;
an upper wiring layer arranged on the string;
at least one intermediate wiring layer arranged between the plurality of electrode layers through the channel layer in an intermediate region of the string;
a lower wiring layer arranged under the string; and
at least one connector arranged in the at least one intermediate wiring layer and connecting at least two channel layers to each other, the at least two channel layers being divided by the at least one intermediate wiring layer, and the at least one connector including at least one of an N− layer and an N+ layer in contact with the at least one intermediate wiring layer.

2. The three-dimensional flash memory device of claim 1, wherein the at least one connector includes both the N− layer and the N+ layer, the N+ layer surrounding the N− layer and contacting the at least one intermediate wiring layer.

3. The three-dimensional flash memory device of claim 1, wherein the at least one connector includes the N− layer surrounded by and contacting the at least one intermediate wiring layer.

4. The three-dimensional flash memory device of claim 1, wherein the at least one connector includes the N+ layer surrounded by and contacting the at least one intermediate wiring layer.

5. The three-dimensional flash memory device of claim 1, further comprising a substrate including a P type bulk and an N+ contact, the substrate supporting a bulk erase operation, and the at least two channels connected to each other by the at least one connector are connected to the P type bulk.

6. The three-dimensional flash memory device of claim 1, wherein the at least one connector includes:
the N+ layer deposited under the at least one intermediate wiring layer; and
the N− layer arranged on the N+ layer and surrounded by and contacting the at least one intermediate wiring layer.

7. The three-dimensional flash memory device of claim 1, wherein the at least one connector includes:
the N+ layer deposited under the at least one intermediate wiring layer; and
the N− layer surrounded by and contacting both the N+ layer and the at least one intermediate wiring layer.

8. The three-dimensional flash memory device of claim 1, wherein the upper wiring layer, the at least one intermediate wiring layer, and the lower wiring layer form an inversely stepwise shape with extension lengths thereof being different from each other.

9. The three-dimensional flash memory device of claim 8, wherein the respective extension lengths of the inversely stepwise shape of the upper wiring layer, the at least one intermediate wiring layer, and the lower wiring layer decrease in the stated order.

10. The three-dimensional flash memory device of claim 8, wherein the upper wiring layer, the at least one intermediate wiring layer, and the lower wiring layer are respectively connected to plugs on a same line on a single substrate.

11. The three-dimensional flash memory device of claim 1, wherein each of the upper wiring layer, the at least one intermediate wiring layer, and the lower wiring layer is one of a drain electrode and a source electrode.

\* \* \* \* \*